(12) United States Patent
Mori et al.

(10) Patent No.: US 9,570,601 B2
(45) Date of Patent: Feb. 14, 2017

(54) SEMICONDUCTOR DEVICE AND METHOD OF MANUFACTURING THE SAME

(71) Applicant: HITACHI, LTD., Chiyoda-ku, Tokyo (JP)

(72) Inventors: Yuki Mori, Tokyo (JP); Toshiyuki Mine, Tokyo (JP); Hiroshi Miki, Tokyo (JP); Mieko Matsumura, Tokyo (JP); Hirotaka Hamamura, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 14/904,685

(22) PCT Filed: Jul. 16, 2013

(86) PCT No.: PCT/JP2013/069326
§ 371 (c)(1),
(2) Date: Jan. 12, 2016

(87) PCT Pub. No.: WO2015/008336
PCT Pub. Date: Jan. 22, 2015

(65) Prior Publication Data
US 2016/0149025 A1 May 26, 2016

(51) Int. Cl.
*H01L 29/15* (2006.01)
*H01L 31/0312* (2006.01)
(Continued)

(52) U.S. Cl.
CPC ....... *H01L 29/7802* (2013.01); *H01L 29/1608* (2013.01); *H01L 29/45* (2013.01);
(Continued)

(58) Field of Classification Search
USPC .......... 257/77, 135–136, 242, 329, E27.091, 257/E27.095–E29.096, E29.118, E29.274, 257/E29.313, E29.262, E27.052, E27.079, 257/E29.036–E29.038, E29.046–29.196, 257/E29.211–E29.225, E27.41, E21.629, 257/E21.643, E29.297–E29.298, E21.603, 257/E21.605; 438/136, 137, 156, 173, 438/192, 206, 212
See application file for complete search history.

(56) References Cited

U.S. PATENT DOCUMENTS 7,338,869 B2    3/2008  Fukuda et al.
7,829,416 B2   11/2010  Kudou et al.
(Continued)

FOREIGN PATENT DOCUMENTS

JP      6-151817 A     5/1994
JP    2005-101148 A    4/2005
(Continued)

OTHER PUBLICATIONS

Senzaki, J. et al.; "Evaluation of 4H-SiC Thermal Oxide Reliability Using Area-Scaling Method"; Japan Journal of Applied Physics; vol. 48; pp. 081404-1 to 4; (2009).

*Primary Examiner* — Tram H Nguyen
(74) *Attorney, Agent, or Firm* — Miles & Stockbridge P.C.

(57) ABSTRACT

Provided is a technique of securing reliability of a gate insulating film, as much as in a Si power MOSFET, in a semiconductor device in which a semiconductor material having a larger band gap than silicon is used, and which is typified by, for example, an SiC power MOSFET. In order to achieve this object, in the in the SiC power MOSFET, the gate electrode GE is formed in contact with the gate insulating film GOX, and is formed of the polycrystalline silicon film PF1 having the thickness equal to or smaller than 200 nm, and the polycrystalline silicon film PF2 formed in contact with the polycrystalline silicon film PF1, and having any thickness.

11 Claims, 23 Drawing Sheets

(51) Int. Cl.
    *H01L 29/78*           (2006.01)
    *H01L 29/49*           (2006.01)
    *H01L 29/66*           (2006.01)
    *H01L 29/16*           (2006.01)
    *H01L 29/45*           (2006.01)

(52) U.S. Cl.
    CPC ...... *H01L 29/4925* (2013.01); *H01L 29/4933* (2013.01); *H01L 29/66068* (2013.01)

(56) References Cited

U.S. PATENT DOCUMENTS

| | | |
|---|---|---|
| 2005/0062048 A1 | 3/2005 | Hayashi et al. |
| 2009/0227098 A1 | 9/2009 | Matsuyama |
| 2010/0075474 A1* | 3/2010 | Kudou ................ H01L 29/78 438/197 |
| 2013/0062622 A1* | 3/2013 | Tsuchiya ............ H01L 29/7394 257/77 |
| 2013/0075756 A1* | 3/2013 | Arthur ................ H01L 21/045 257/77 |
| 2015/0236151 A1* | 8/2015 | McMahon ......... H01L 29/7827 257/77 |

FOREIGN PATENT DOCUMENTS

| | | |
|---|---|---|
| JP | 2006-156478 A | 6/2006 |
| JP | 2009-212366 A | 9/2009 |
| JP | 4365894 B2 | 11/2009 |
| JP | 2012-044067 A | 3/2012 |
| JP | 2013-05214 A | 3/2013 |
| WO | WO 2004/003989 A1 | 1/2004 |

\* cited by examiner

SEMICONDUCTOR DEVICE AND METHOD OF MANUFACTURING THE SAME

TECHNICAL FIELD

The present invention relates to a semiconductor device and a manufacturing technique of the same. The present invention particularly relates to a technique which is advantageous when being applied to a semiconductor device in which a semiconductor material having a larger bad gap than silicon is used, and to a manufacturing technique of the same.

BACKGROUND ART

Conventionally, a power metal oxide semiconductor field effect transistor (MOSFET) using a silicon substrate (Si substrate) (hereinafter, referred to as a Si power MOSFET) has been mainly used in power MOSFET's, which are one type of power semiconductor devices.

However, a power MOSFET using a silicon carbide substrate (hereinafter, referred to as a SiC substrate) (hereinafter, referred to as a SiC power MOSFET) can achieve a high withstand voltage, and low loss as compared to the Si power MOSFET. The reason is that the silicon carbide (SiC) has a larger band gap as compared to silicon (Si), thus has a high dielectric breakdown withstand voltage, and as a result, capable of securing the withstand voltage even when thinning a drift layer. In other words, since the drift layer is thinned and the dielectric breakdown withstand voltage can be secured even when the drift layer in the SiC power MOSFET is thinned, it is possible to reduce on-resistance of the SiC power MOSFET. Thus, more attention has been given to the SiC power MOSFET in the field of power-saving and/or environmentally-conscious inverter techniques.

A basic structure of the SiC power MOSFET is the same as that of the Si power MOSFET. That is, a drift layer of a first conductivity type is formed on a substrate made of SiC, and a well region of a second conductivity type is formed in a part of the drift layer. Further, a source region of the first conductivity type is formed in a part of the well region, a gate insulating film is formed on a substrate surface of a region called a channel which extends from the source region, via the well region, to the drift layer, and a gate electrode is formed on the gate insulating film. For operation as a transistor, a potential of a top surface of the channel is controlled via the gate insulating film by controlling a potential of the gate electrode, and channel current, that is, current flowing from the source region, via the well region, to the drift layer is controlled.

Here, in general, polycrystalline silicon (polysilicon) and silicon dioxide (silicon oxide: $SiO_2$), which are already proven to be advantageous in the Si power MOSFET, are frequently applied as materials for the gate electrode and the gate insulating film in the SiC power MOSFET as described in Patent Document 1.

In this manner, since the materials proven in the Si power MOSFET, that is, the silicon oxide and the polycrystalline silicon are used in the gate insulating film and the gate electrode in the SiC power MOSFET, it has been expected that the reliability equivalent to that in the case of the Si power MOSFET is maintained.

However, it has been known that it is difficult to achieve the same level of reliability as that in the case of forming the silicon oxide on the Si substrate in the silicon oxide formed on the SiC substrate, and a so-called extrinsic breakdown, in which dielectric breakdown is caused at voltage lower than the original dielectric withstand voltage, is generated with a high probability, for example, as described in Non-Patent Document 1.

The reason why the extrinsic breakdown is frequently generated in the silicon oxide formed on the SiC substrate is that there are many defects in the SiC substrate as compared to the Si substrate. Thus, a technique of forming a highly reliable silicon oxide film on the SiC substrate having many defects has been actively studied, for example, as indicated in Patent Document 2 and Patent Document 3. However, it has not been reported, so far, that the reliability of the gate insulating film is achieved in the SiC power MOSFET as much as the Si power MOSFET.

RELATED ART DOCUMENTS

Patent Documents

Patent Document 1: Japanese Patent Application Laid-Open Publication No. 2009-212366
Patent Document 2: Japanese Patent Application Laid-Open Publication No. 2005-101148
Patent Document 3: Japanese Patent Application Laid-Open Publication No. 2006-156478

Non-Patent Document

Non-Patent Document 1: J. Senzaki, et al, "Evaluation of 4H-SiC Thermal Oxide Reliability Using Area-Scaling Method," Japan Journal of Applied Physics, vol. 48 pp. 081404-1 to 4, (2009).

SUMMARY OF THE INVENTION

Problems to be Solved by the Invention

A power MOSFET is a switching device to be used for control of a power supply system, and is required to have a high reliability so as not to be broken during operation. A dielectric breakdown of a gate insulating film is one of failure modes which are concerned in the MOSFET. Thus, prior to shipping as a product, a screening is carried out by performing a test in which a higher voltage than an operating condition is applied to a gate electrode and the like, and shipping only a non-defective product that has passed in the test. At this time, production cost increase when a production yield after the screening is low, and thus, there is a demand for a technique of forming a high-quality gate insulating film that is less likely to fail in the test. In particular, it is difficult to achieve the reliability of the gate insulating film in the SiC power MOSFET as much as the Si power MOSFET, and accordingly, studies on improving the reliability of the gate insulating film have been actively carried out.

An object of the present invention is to provide a technique of securing reliability of a gate insulating film, as much as in a Si power MOSFET, in a semiconductor device in which a semiconductor material having a larger band gap than silicon is used, and which is typified by, for example, an SiC power MOSFET.

The other problems and novel characteristics of the present invention will be apparent from the description of the present specification and the accompanying drawings.

Means for Solving the Problems

A semiconductor device according to an embodiment includes: a) a substrate of a first conductivity type which has a first main surface and a second main surface opposite to the first main surface, and is made of a semiconductor material having a larger band gap than silicon; (b) a drift layer of the first conductivity type formed on the first main surface of the substrate; (c) a well region of a second conductivity type which has a first depth from a top surface of the drift layer, and is obtained by introducing a first impurity of the second conductivity type different from the first conductivity type into the drift layer; and (d) a source region of the first conductivity type which has a second depth from the top surface of the drift layer, and is disposed in the well region being separated from an end portion of the well region, and into which a second impurity of the first conductivity type is introduced. The semiconductor device further includes: (e) a gate insulating film which is in contact with, at least, the well region between the drift layer and the source region; (f) a gate electrode which is in contact with the gate insulating film; and (g) a drain region of the first conductivity type formed on the second main surface side of the substrate. Here, the gate electrode includes: (f1) a damage suppressing layer which is in contact with the gate insulating film and suppresses damage on the gate insulating film; and (f2) a resistance reducing layer which is formed on the damage suppressing layer and reduces a gate electrode resistance more than a case without providing the resistance reducing layer, and the damage suppressing layer is formed using a second material different from a first material for forming the drift layer and the well region.

Further, a method of manufacturing a semiconductor device according to an embodiment includes the steps of: (a) preparing a substrate of a first conductivity type made of a semiconductor material having a larger band gap than silicon; (b) forming a drift layer of the first conductivity on a first main surface of the substrate; and (c) forming a drain region of the first conductivity type on a second main surface, which is opposite to the first main surface, of the substrate. Next, the method includes (d) a step of forming a well region of a second conductivity type which has a first depth from a top surface of the drift layer by introducing a first impurity of the second conductivity type different from the first conductivity type into the drift layer. Next, the method includes a step of forming a source region of the first conductivity type which has a second depth from the top surface of the drift layer and is separated from an end portion of the well region by introducing a second impurity of the first conductivity type into the well region after the step (d). Further, the method includes (f) a step of forming a gate insulating film including a part which is in contact with, at least, the well region between the drift layer and the source region after the step (e); and (g) a step of forming a gate electrode which is in contact with the gate insulating film after the step (f). Here, the step (q) includes the steps of: (g1) forming a damage suppressing layer which is in contact with the gate insulating film and suppresses damage on the gate insulating film; and (g2) forming a resistance reducing layer which is formed on the damage suppressing layer and reduces a gate electrode resistance more than a case without providing the resistance reducing layer. Then, the damage suppressing layer is formed using a second material different from a first material for forming the drift layer and the well region.

Effects of the Invention

According to an embodiment, it is possible to secure reliability of a gate insulating film in a semiconductor device in which a semiconductor material having a larger band gap than silicon is used, and which is typified by, for example, an SiC power MOSFET.

BRIEF DESCRIPTIONS OF THE DRAWINGS

DETAILED DESCRIPTION OF PREFERRED EMBODIMENTS

Figure 1:
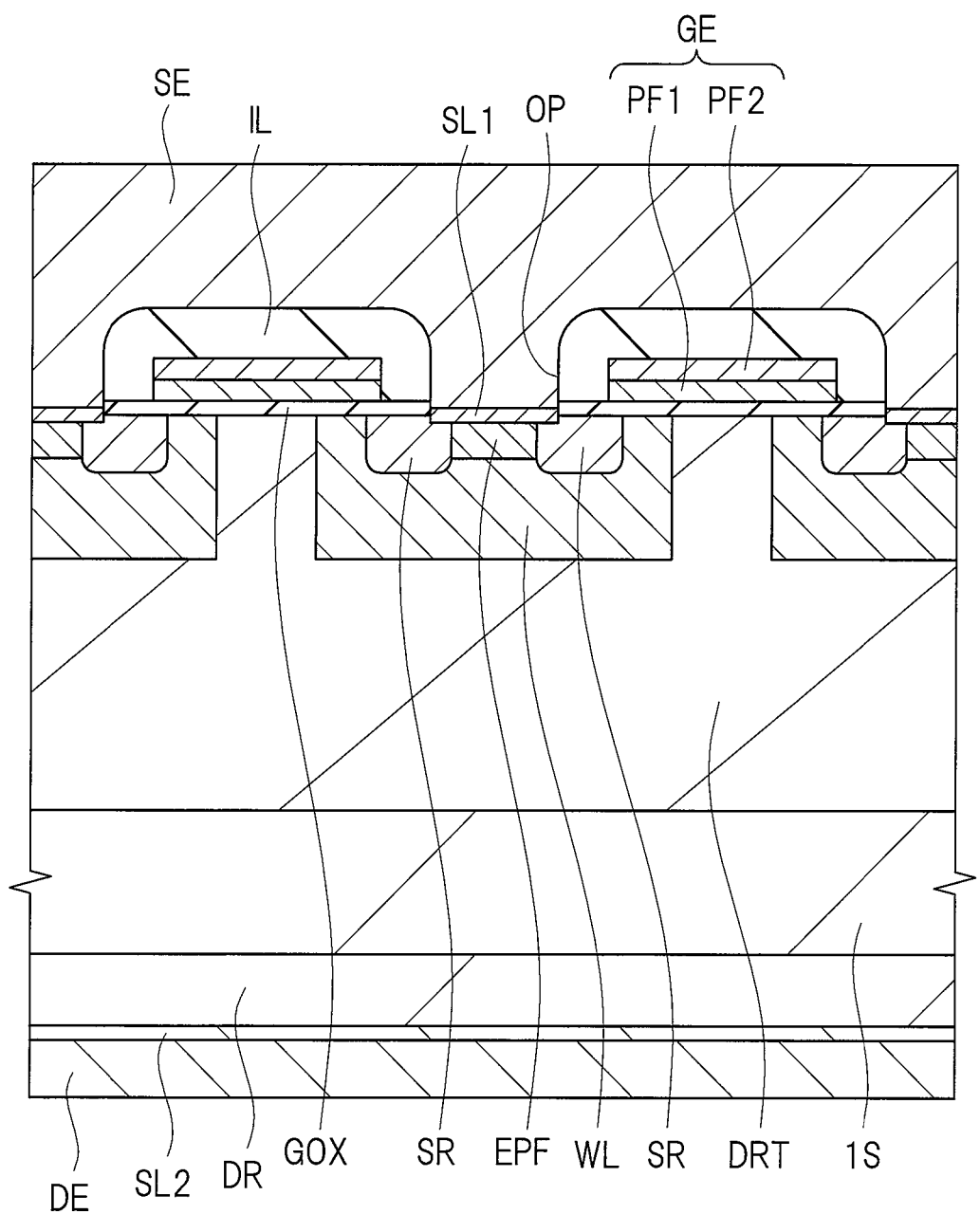
FIG. 1 is a cross-sectional view illustrating a configuration of a SiC power MOSFET according to a first embodiment.

In the following embodiment, when there is the necessity for convenience, the explanation will be divided into plural sections or plural embodiments. However, unless otherwise specified, they are not irrelevant with each other but they have a relationship that one is a modified example, an application, detailed explanation, and supplementary explanation of a part or all of the other.

Further, in the following embodiment, when the number of elements, etc. (including the number, a numeric value, quantity, a range, etc.) is referred to, the number of elements may be not restricted to a specific number but may be more than or less than the specific number, except for the case where it is specified in particular or clearly restricted to the specific number in principle.

In the following embodiment, a component (including an element step etc.) referred to is not always essential, except for the case where it is specified in particular or clearly considered to be essential in principle.

Similarly, in the following embodiment, when referring to the shape, positional relationship, etc. of a component etc, what is analogous or similar substantially to the shape, positional relationship etc. shall be included, except for the case where it is specified in particular or clearly not considered to be so in principle. The same applies to the number of elements (including the number, a numeric value, quantity, a range, etc.) described above.

In a drawing employed in the embodiments, even if it is a sectional view, hatching may be omitted in order to make the drawing easier to see. Even if the drawing is a plan view, hatching may be attached on the contrary in order to make the drawing easier to see.

Incidentally, in the present specification, a wide-band-gap semiconductor material refers to a semiconductor material having a band gap larger than a band gap (1.12 eV) of silicon, and examples thereof includes silicon carbide (2.20 to 3.02 eV), gallium nitride (3.39 eV), diamond (5.47 eV), and the like. A wide-band-gap semiconductor device refers to a semiconductor device in which the above-described wide-band-gap semiconductor material is used as its substrate.

(First Embodiment)
<Configuration of SiC Power MOSFET>
A description will be made with reference to FIG. 1 regarding a structure of an n-channel SiC power MOSFET forming a wide-band-gap semiconductor device according to a first embodiment of the present invention.

FIG. 1 is a cross-sectional view of main parts of the SiC power MOSFET according to the first embodiment. As illustrated in FIG. 1, an n$^-$-type drift layer DRT made of silicon carbide (SiC) having a lower impurity concentration than a substrate 1S made of n$^+$-type SiC is formed on a top surface (first main surface) of the n$^+$-type substrate 1S made of silicon carbide (SiC). A thickness of the n$^-$-type drift layer DRT is about, for example, 5 μm to 20 μm.

A p-type well region (body region) WL, which has a predetermined depth from a top surface of the n$^-$-type drift layer DRT, is formed in the n$^-$-type drift layer DRT. Further, an n$^+$-type source region SR is formed in the p-type well region WL so as to have a predetermined depth from the top surface of the n$^-$-type drift layer DRT, and be separated from an end portion of the p-type well region WL.

The depth of the p-type well region WL from the top surface of the drift layer DRT is about, for example, 0.5 μm to 2.0 μm. In addition, the depth of the n$^+$-type source region SR from the top surface of the drift layer DRT is about, for example, 0.1 μm to 0.4 μm.

Further, a p$^{++}$-type potential fixing layer EPF, which has a predetermined depth from the top surface of the n$^-$-type drift layer DRT, and further, fixes a potential of the p-type well region WL, is formed in the p-type well region WL. The depth of the p$^{++}$-type potential fixing layer EPF from the top surface of the drift layer DRT is about, for example, 0.05 μm to 0.2 μm.

Further, an n$^+$-type drain region DR is formed so as to have a predetermined depth from a rear surface (second main surface) of the substrate 1S.

Incidentally, "$-$" and "$+$" are reference signs that represents a relative impurity concentration having an n$^-$-type or p-type conductivity type. For example, it is indicated that the impurity concentration of an n$^-$-type impurity increases in the order of "n$^{--}$", "n$^-$", "n$^+$" and "n$^{++}$".

A preferable range of the impurity concentration of the n$^+$-type SiC substrate 1S is, for example, $1 \times 10^{18}$ cm$^{-3}$ to $1 \times 10^{21}$ cm$^{-3}$, and a preferable range of the impurity concentration of the n$^-$-type drift layer DRT is, for example, $1 \times 10^{14}$ cm$^{-3}$ to $1 \times 10^{17}$ cm$^{-3}$. In addition, a preferable range of the impurity concentration of the p$^{++}$-type potential fixing layer EPF is, for example, $1 \times 10^{19}$ cm$^{-3}$ to $1 \times 10^{21}$ cm$^{-3}$, and a preferable range of the impurity concentration of the p-type well region WL is, for example, $1 \times 10^{16}$ cm$^{-3}$ to $1 \times 10^{19}$ cm$^{-3}$. In addition, a preferable range of the impurity concentration of the n$^+$-type source region SR is, for example, $1 \times 10^{17}$ cm$^{-3}$ to $1 \times 10^{21}$ cm$^{-3}$.

A gate insulating film GOX is formed on the top surface of the substrate 1S in a region extending from the source region SR, via the well region WL, to the drift layer DRT, and a polycrystalline silicon film (polysilicon film) PF1 is formed so as to be in contact with the gate insulating film GOX. Further, a polycrystalline silicon film PF2 is additionally formed on the polycrystalline silicon film PF1, and a gate electrode GE is formed by the polycrystalline silicon film PF1 and the polycrystalline silicon film PF2. Both the gate insulating film GOX and the gate electrode GE are covered by an interlayer insulating film IL made of, for example, a silicon oxide film.

Each conductivity type of the polycrystalline silicon film PF1 and the polycrystalline silicon film PF2 is, for example, an n$^+$-type. In addition, a preferable range of a film thickness of the polycrystalline silicon film PF1 is, for example, equal to or smaller than 200 nm.

Further, a part of the n$^+$-type source region SR and the p$^{++}$-type potential fixing layer EPF are exposed at a bottom surface of an opening portion OP formed in the interlayer insulating film IL, and a metal silicide layer SL1 is formed on top surfaces thereof. Further, the part of the n$^+$-type source region SR and the p$^{++}$-type potential fixing layer EPF are electrically connected to a source electrode SE via the metal silicide layer SL1. In addition, the n$^+$-type drain region DR is electrically connected to a drain electrode DE via a metal silicide layer SL2.

Here, a gate potential is applied to the gate electrode GE from the outside, a source potential is applied to the source electrode SE, and a drain potential is applied to the drain electrode DE from the outside.

<New Finding that Present Inventors Have Found Out>
Next, new findings that the present inventors have found out regarding the SiC power MOSFET will be described.

In the SiC power MOSFET, it is possible to perform a switching operation that controls current flowing between the source electrode SE and the drain electrode DE by controlling a voltage to be applied to the gate electrode GE. That is, when an on-voltage equal to or higher than a threshold voltage is applied to the gate electrode GE, a top surface of the p-type well region WL is inversed, and an effective n⁻-type layer (also called an inversion layer) is generated. In this case, a current path passing from the source electrode SE through the drain electrode DE formed on the rear surface of the substrate 1S made of the n⁺-type SiC is generated via the inversion layer (effective n⁻-type layer) formed on the top surface of the p-type well region WL and the n⁻-type drift layer DRT.

On the other hand, the p-type well region WL is not inversed at the time of gate off at which a voltage lower than the threshold voltage is applied to the gate electrode GE, and thus, the current does not flow between the source electrode SE and the drain electrode DE.

Incidentally, a design that causes a reverse electric field to be applied in a pn junction portion between the p-type well region WL and the n⁻-type drift layer DRT during an operation to turn off the SiC power MOSFET. At this time, it is possible to secure the withstand voltage when a high reverse bias is applied to the drain electrode DE at the time of gate off by appropriately setting the impurity concentration of the n⁻-type drift layer DRT, and sufficiently securing a width of a depletion layer of the pn junction portion between the p-type well region WL and the n⁻-type drift layer DRT. It is possible to increase the above-described withstand voltage as the band gap of a semiconductor material for forming the substrate 1S and the drift layer DRT becomes wider. Thus, it is desirable that the wide-band-gap semiconductor material typified by the silicon carbide be used in the semiconductor device for a power device.

However, it has been known that a dielectric breakdown failure in the gate insulating film GOX, that is, a so-called "extrinsic breakdown", is frequently generated in the SiC power MOSFET as compared to the case of using the silicon (Si). As a reason thereof, it is often pointed out that the substrate 1S made of the silicon carbide has more defects than the substrate made of the silicon.

In regard to such a point, the present inventors have focused on another viewpoint different from the number of defects. That is, the present inventors have paid attention on a point that a physical constant such as a thermal expansion coefficient is different between the silicon carbide and the silicon. A relationship illustrated in FIG. 2 supports the latter model. The present inventors have found out that it is possible to reduce the "extrinsic breakdown" in the SiC power MOSFET to a level close to that of the case of using the substrate made of the silicon depending on how to make the gate electrode from an evaluation result illustrated in FIG. 2.

Figure 2:
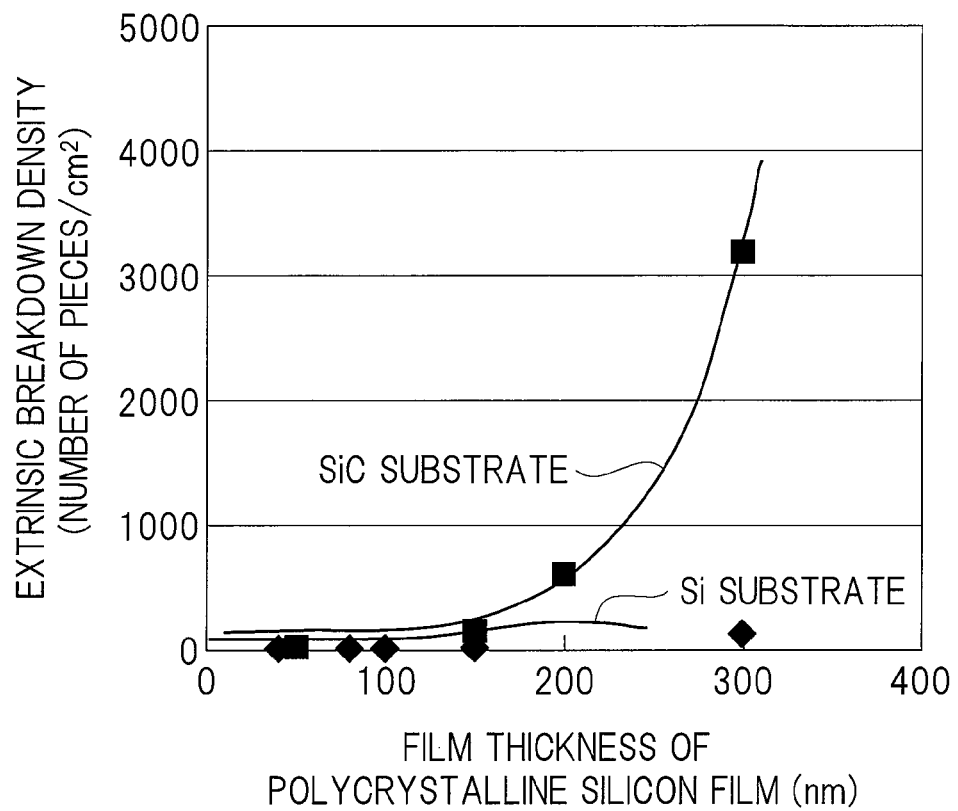
FIG. 2 is a graph illustrating a relationship between an extrinsic breakdown density of a MOS device and a film thickness of a polycrystalline silicon film forming a gate electrode.
Figure 3:
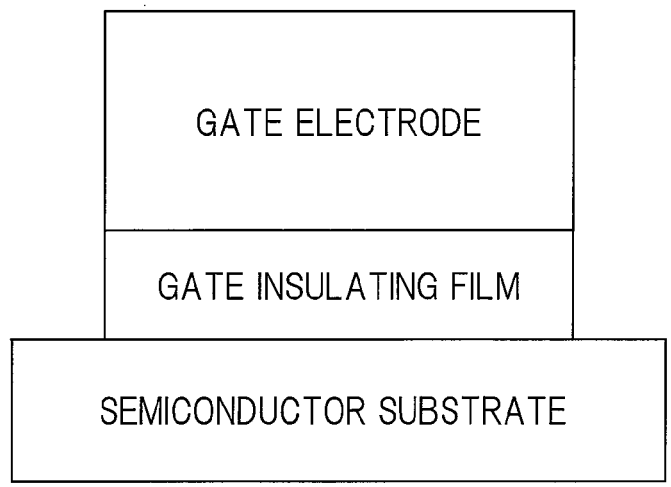
FIG. 3 is a schematic view illustrating a structure of the MOS device used when examining the relationship of FIG. 2.

Hereinafter, the evaluation result of FIG. 2 will be described in detail. In the evaluation of FIG. 2, a MOS (Metal Oxide Semiconductor) device imitating only the structure of the gate electrode and the gate insulating film in the MOSFET, that is, an evaluating device provided with a gate insulating film and a gate electrode made of a polycrystalline silicon film laminated on a semiconductor substrate as illustrated in FIG. 3 was used.

Figure 4:
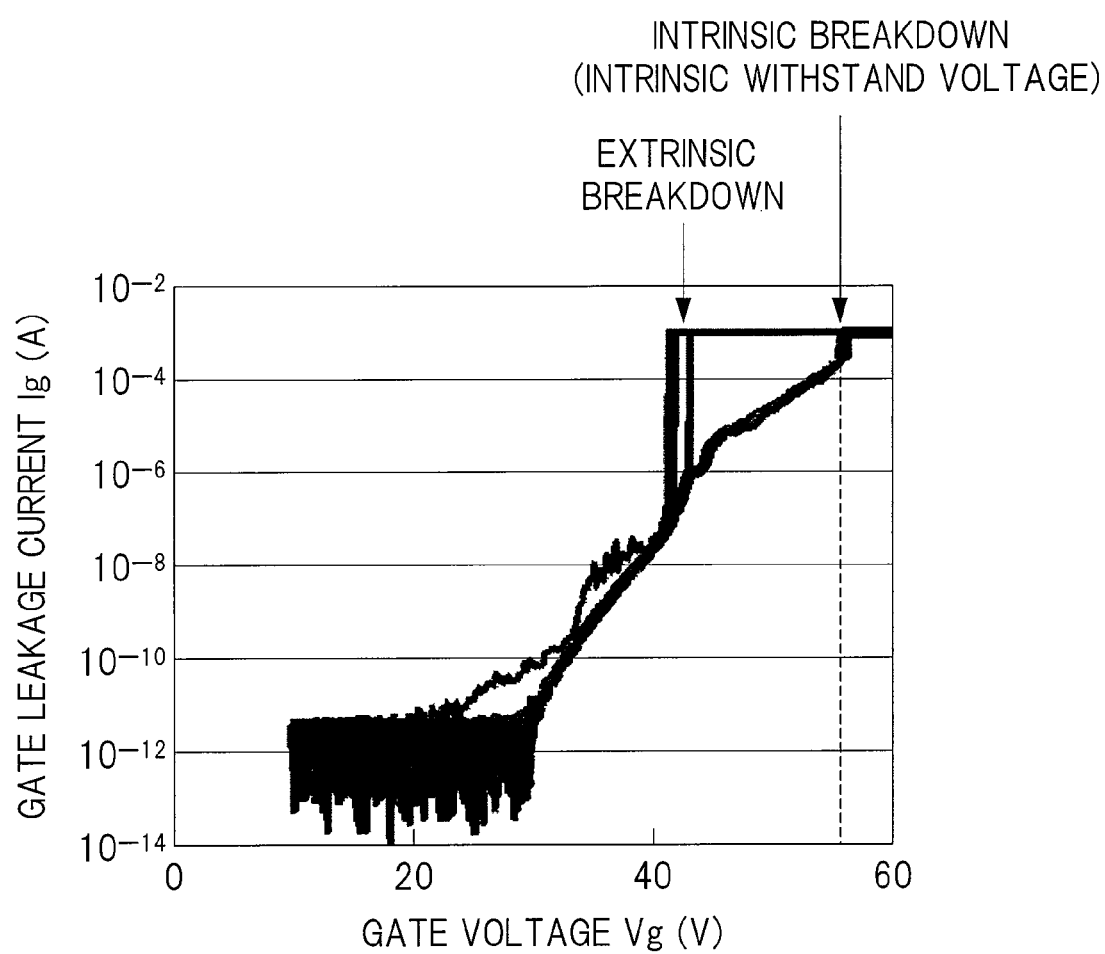
FIG. 4 is a graph illustrating an example of a measurement result that describes "extrinsic breakdown" defined when examining the relationship of FIG. 2.

In addition, as definition of the "extrinsic breakdown", a withstand voltage test as illustrated in FIG. 4, that is, a test for checking a voltage at which the dielectric breakdown is caused in the MOS device when the voltage between the gate electrode and the substrate is sequentially increased from a lower side, was performed on a plurality of the MOS devices, and then, a case where the dielectric breakdown was caused at a lower voltage than the original withstand voltage called as an intrinsic withstand voltage (intrinsic breakdown) was considered as the "extrinsic breakdown". For calculation of an "extrinsic breakdown density", the number of the MOS devices in which the "extrinsic breakdown" was caused was divided by the area of the gate insulating films of the total MOS devices to be evaluated, that is, the total opposing surface area between the gate insulating films and the substrates, and a value per unit area was obtained. FIG. 2 illustrates the evaluation result obtained by performing the above-described evaluation of the "extrinsic breakdown density" with respect to each of the MOS devices having a different film thickness of the polycrystalline silicon film formed on the silicon carbide substrate (SiC substrate) and the silicon substrate (Si substrate).

Incidentally, a silicon oxide film formed by thermally oxidizing the substrate was used as the gate insulating film applied in the experiment in FIG. 2. In addition, the gate electrode was formed using the polycrystalline silicon film which was formed by causing amorphous silicon doped with P (Lin) to be deposited by a CVD (Chemical Vapor Deposition) method, and then, performing crystallization annealing. Both processes that form the silicon oxide film and the polycrystalline silicon film are generally applied in the SiC power MOSFET and the Si power MOSFET.

Based on the experimental result illustrated in FIG. 2, it is understood that the "extrinsic breakdown density" drastically increases when the film thickness of the polycrystalline silicon film of the gate electrode becomes larger than 200 nm in a case where the MOS device is formed on the silicon carbide substrate. On the other hand, such a drastic increase of the "extrinsic breakdown density", which depends on the film thickness of the polycrystalline silicon film, has not been found in a case where the MOS device is formed on the silicon substrate. Accordingly, it is understood that the drastic increase of the "extrinsic breakdown density" in a specification where the film thickness of the polycrystalline silicon film is larger than 200 nm, found in the MOS device on the silicon carbide substrate, corresponds to a unique phenomenon in the case of forming the MOS device on the silicon carbide substrate.

A difference in a thermal expansion rate between the silicon carbide and the silicon is suspected as a reason of the experimental result illustrated in FIG. 2. That is, it is considered that stress due to such difference in the thermal expansion rate between the both is generated in the silicon oxide film, which is the gate insulating film interposed between the silicon carbide substrate and the polycrystalline silicon film, if a thermal load is applied by crystallization annealing or silicide annealing when the MOS device having the polycrystalline silicon film as the gate electrode is formed on the silicon carbide substrate, or after the MOS device is formed, and a vulnerable point which likely causes the "extrinsic breakdown" is generated in some cases. In addition, it is considered that such stress, which is generated in the gate insulating film due to the difference in the thermal expansion rate between the silicon carbide and the silicon, increases as the film thickness of the polycrystalline silicon film formed on the gate insulating film increases. A behavior of the stress in the gate insulating film, which is generated due to the difference in the thermal expansion rate between the silicon and the silicon carbide, can elucidate the experimental result of FIG. 2. That is, it can be interpreted that, in the case of the MOS device on the silicon carbide substrate, the stress generated in the gate insulating film almost does not affect deterioration in a film quality of the gate insulating film until the film thickness of the polycrystalline silicon film on the gate insulating film is about 200 nm, but causes the deterioration in the film quality of the gate insulating film when the film thickness becomes larger than 200 nm, and has a tendency that increases the "extrinsic breakdown density".

On the other hand, it is considered that, in the case of the MOS device on the silicon substrate, the great stress is not generated on the silicon oxide film, which is the gate insulating film interposed between the polycrystalline silicon film and the silicon substrate having substantially the same thermal expansion rate, and as a result, the drastic increase of the "extrinsic breakdown density" accompanying the increase of the film thickness of the polycrystalline silicon film has not been observed as in the case of the MOS device formed on the silicon carbide substrate.

Based on the above consideration, it is possible to say that it is effective to thin the film thickness of the polycrystalline silicon film forming the gate electrode to be smaller than 200 nm in order to reduce the "extrinsic breakdown density" in the SiC power MOSFET as much as the Si power MOSFET. Further, based on the experimental result illustrated in FIG. 2, it is possible to say that it is desirable to set the film thickness of the polycrystalline silicon film forming the gate electrode to be equal to or larger than 50 nm and equal to or smaller than 100 nm. However, there is room for improvement because the thinning of the polycrystalline silicon film of the gate electrode leads increase in a sheet resistance, thereby causing deterioration in the performance such as response speed of the SiC power MOSFET. Thus, a design with respect to the room for improvement has been devised in the first embodiment. Hereinafter, a description will be made regarding a characteristic of the first embodiment provided with such a design.

<Characteristic According to First Embodiment>

The characteristic according to the first embodiment is a structure of the gate electrode GE. That is, as illustrated in FIG. 1, in the SiC power MOSFET according to the first embodiment, the gate electrode GE is formed in contact with the gate insulating film GOX, and is formed of the polycrystalline silicon film PF1 having the thickness of equal to or smaller than 200 nm, and the polycrystalline silicon film PF2 formed in contact with the polycrystalline silicon film PF1, and having any thickness. The thickness of the polycrystalline silicon film PF2 is determined so as to achieve a gate electrode resistance required in an operational specification of the SiC power MOSFET.

In addition, when depositing the polycrystalline silicon film PF1 and the polycrystalline silicon film PF2, the polycrystalline silicon film PF1 is first deposited in the state of the polycrystalline silicon to have the film thickness of equal to or smaller than 200 nm, or deposited in an amorphous state, and then, the polycrystalline silicon film is formed using crystallization annealing. Thereafter, the polycrystalline silicon film PF2 is formed by any method between performing deposition in the state of polycrystalline silicon to have the film thickness to be determined according to a target specification of the gate electrode resistance, or, performing deposition in the amorphous state, and then, forming the polycrystalline silicon film using crystallization annealing.

At this time, the polycrystalline silicon film PF1 has the film thickness of equal to or smaller than 200 nm, and thus, it is possible to reduce the stress generated in the gate insulating film GOX due to the polycrystalline silicon film PF1 according to the relationship illustrated in FIG. 2. As a result, according to the SiC power MOSFET of the first embodiment, it is possible to suppress the "extrinsic breakdown density" to a level close to that of the Si power MOSFET with causing little deterioration in the film quality of the gate insulating film GOX. On the other hand, since the polycrystalline silicon film PF2 is not in direct contact with the gate insulating film GOX, the polycrystalline silicon film PF2 does not cause the deterioration of the gate insulating film GOX.

In this manner, in the SiC power MOSFET using the silicon carbide, it is important to form the gate electrode using a plurality of layers (for example, two layers) in order to obtain a desired gate electrode resistance while suppressing the "extrinsic breakdown density" as much as in the Si power MOSFET. That is, the SiC power MOSFET according to the first embodiment has a characteristic point in terms of forming the gate electrode GE using the two layers of a damage suppressing layer, which suppresses damage applied to the gate insulating film GOX, and a resistance reducing layer which contributes to the reduction of the gate electrode resistance than the case without providing the resistance reducing layer. Further, for example, when the damage suppressing layer is formed using the polycrystalline silicon film PF1 of which the film thickness is equal to or smaller than 200 nm, and the resistance reducing layer is formed using the polycrystalline silicon film PF2 having the film thickness determined by the specification of the gate electrode resistance as described above, it is possible to form the gate electrode GE as the characteristic of the first embodiment.

Incidentally, the description has been made regarding the n-channel SiC power MOSFET in the first embodiment, a technical idea according to the first embodiment is not limited thereto, and can be applied to, for example, a p-channel SiC power MOSFET. Further, it is possible to obtain the effect according to the first embodiment without depending on the conductivity type of the substrate 1S with which the gate insulating film GOX is in contact, and further, on each conductivity type of the polycrystalline silicon film PF1 and the polycrystalline silicon film PF2 to be used in the gate electrode GE.

In this manner, the technical idea according to the first embodiment is a novel idea which does not exist in the related art in terms that the focus has been placed on the fact that the reliability of the gate insulating film GOX is degraded when the great stress is applied to the gate insulating film GOX due to the difference in the thermal expansion rate caused by difference between the material of the gate electrode GE, which is in direct contact with the top surface of the gate insulating film GOX and the material of the substrate which is in direct contact with the rear surface of the gate insulating film GOX in the SiC power MOSFET. In other words, although the theory that indicates the many defects of the substrate made of the silicon carbide as the reason that causes the degradation of the reliability of the gate insulating film GOX in the SiC power MOSFET is regarded as a common sense in the related art, the present invention overturns such a common sense, and founds out that the degradation of the reliability of the gate insulating film GOX is caused by the difference in the thermal expansion rate between the materials in contact with the gate insulating film. GOX, which is the advantageous technical idea.

Further, in the first embodiment, the polycrystalline silicon film PF1, which is the thin damage suppressing layer of equal to or smaller than 200 nm that suppresses the damage on the gate insulating film GOX, is formed on, for example, the gate insulating film GOX in order to embody the technical idea. In this case, since the film thickness of the polycrystalline silicon film PF1 is thinned to be equal to or smaller than 200 nm, it is possible to suppress the stress to be applied to the gate insulating film GOX, and accordingly, it is possible to suppress the reduction in the reliability of the gate insulating film GOX.

However, in a case where the gate electrode GE is formed using the polycrystalline silicon film PF1 which is the thin damage suppressing layer of equal to or smaller than 200 nm, there is a side effect that the gate electrode resistance of the gate electrode GE increases although such it is desirable from the viewpoint of improving the reliability of the gate insulating film GOX.

Thus, in the first embodiment, the gate electrode GE is configured to have the two-layer structure including the damage suppressing layer and the resistance reducing layer by providing the polycrystalline silicon film PF2, which is the resistance reducing layer, on the damage suppressing layer. Accordingly, according to the first embodiment, it is possible to reduce the film thickness of the damage suppressing layer so that it is possible to suppress the stress to be applied to the gate insulating film GOX, which is in direct contact with the damage suppressing layer, and as a result, it is possible to improve the reliability of the gate insulating film GOX. Further, according to the first embodiment, the resistance reducing layer is formed on the damage suppressing layer, and thus, it is possible to reduce the gate electrode resistance of the gate electrode GE more than in the case of forming the gate electrode GE using only the damage suppressing layer.

Here, for example, both the damage suppressing layer and the resistance reducing layer are formed using the polycrystalline silicon film in the first embodiment, but a concentration of a conductivity impurity to be introduced in the polycrystalline silicon film PF1, which forms the damage suppressing layer, and a concentration of a conductivity impurity to be introduced in the polycrystalline silicon film PF2, which forms a resistance reducing layer, may be the same or different from each other. However, it is desirable that the impurity concentration of the polycrystalline silicon film PF2, which forms the resistance reducing layer, be higher than the impurity concentration of the polycrystalline silicon film PF1, which forms the damage suppressing layer, from the viewpoint of improving the effect of reducing the gate electrode resistance according to the resistance reducing layer.

Incidentally, even in a case where the damage suppressing layer and the resistance reducing layer are formed using the same type of the polycrystalline silicon films, the formation of the damage suppressing layer and the formation of the resistance reducing layer are performed in separate steps as described later, and thus, a crystal grain straddling the damage suppressing layer and the resistance reducing layer is hardly formed. Thus, it is inferred that an interface between the damage suppressing layer and the resistance reducing layer can be clearly determined. In other words, it is considered that it is possible to clearly distinguish between the damage suppressing layer and the resistance reducing layer even in a case where the damage suppressing layer and the resistance reducing layer are formed using the same type of the polycrystalline silicon films.

<Method of Manufacturing SiC Power MOSFET>

The SIC power MOSFET according to the first embodiment is configured as described above, and a method of manufacturing the same will be described hereinafter with reference to the drawings.

Figure 5:
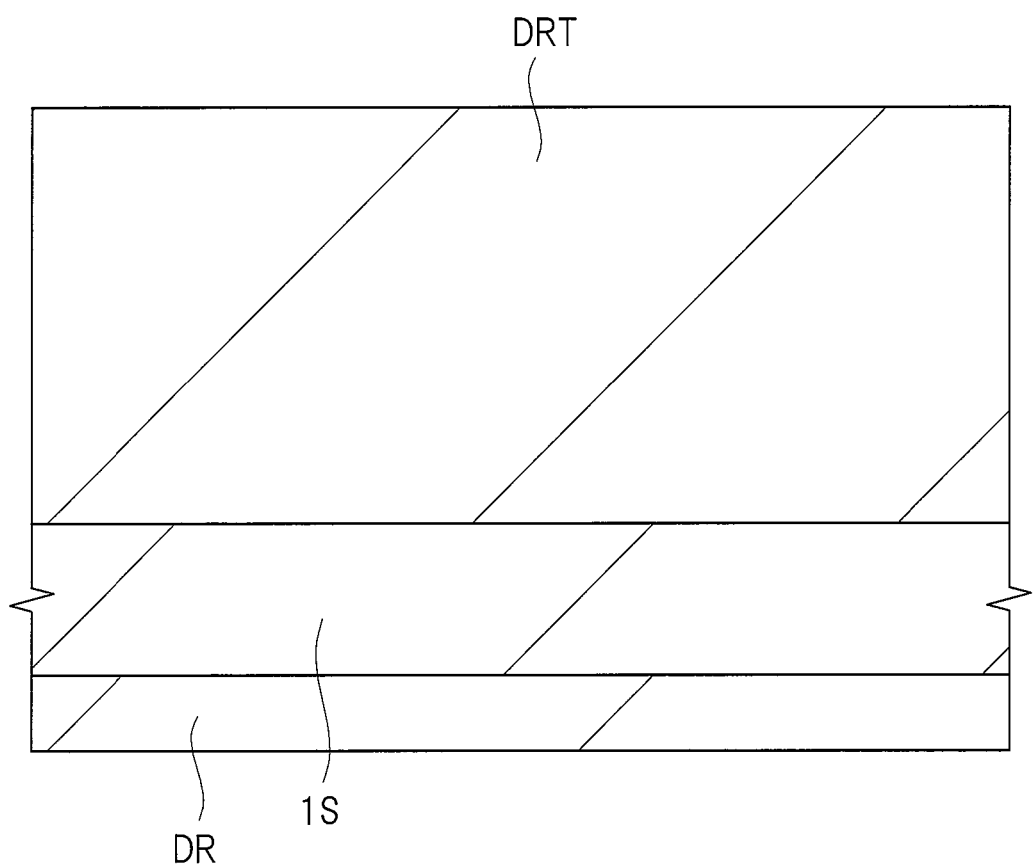
FIG. 5 is a cross-sectional view illustrating a manufacturing process of the SiC power MOSFET according to the first embodiment.

First, the substrate 1S made of an $n^+$-type 4H-SiC substrate is prepared as illustrated in FIG. 5. An $n^-$-type impurity is introduced in the substrate 1S. Then $n^-$-type impurity is, for example, nitrogen (N), and the impurity concentration of then$^-$-type impurity is within a range of, for example, $1 \times 10^{18}$ cm$^{-3}$ to $1 \times 10^{21}$ cm$^{-3}$. In addition, the substrate 1S made of the $n^+$-type SiC substrate has both planes of a Si-plane and a C-plane, and the top surface of the substrate 1S may be either the Si-plane or the C-plane.

Next, the $n^-$-type drift layer DRT made of the silicon carbide is formed on the top surface (the first main surface) of the substrate 1S using an epitaxial growth method. At this time, the $n^-$-type drift layer DRT may be formed using an ion implantation method instead of the epitaxial growth method. The $n^-$-type impurity having a lower impurity concentration than the substrate 1S is introduced in the $n^-$-type drift layer DRT. The impurity concentration of the $n^-$-type drift layer DRT is within a range of, for example, $1 \times 10^{14}$ cm$^{-3}$ to $1 \times 10^{17}$ cm$^{-3}$ although dependent on a device rating of the SiC power MOSFET. In addition, the thickness of the $n^-$-type drift layer DRT is, for example, 5 μm to 20 μm.

Thereafter, the $n^+$-type drain region DR is formed on the rear surface of the substrate 1S so as to have a predetermined depth from the rear surface (the second main surface) of the substrate 1S. The impurity concentration of the $n^+$-type drain region DR is within a range of, for example, $1 \times 10^{19}$ cm$^{-3}$ to $1 \times 10^{21}$ cm$^{-3}$.

Figure 6:
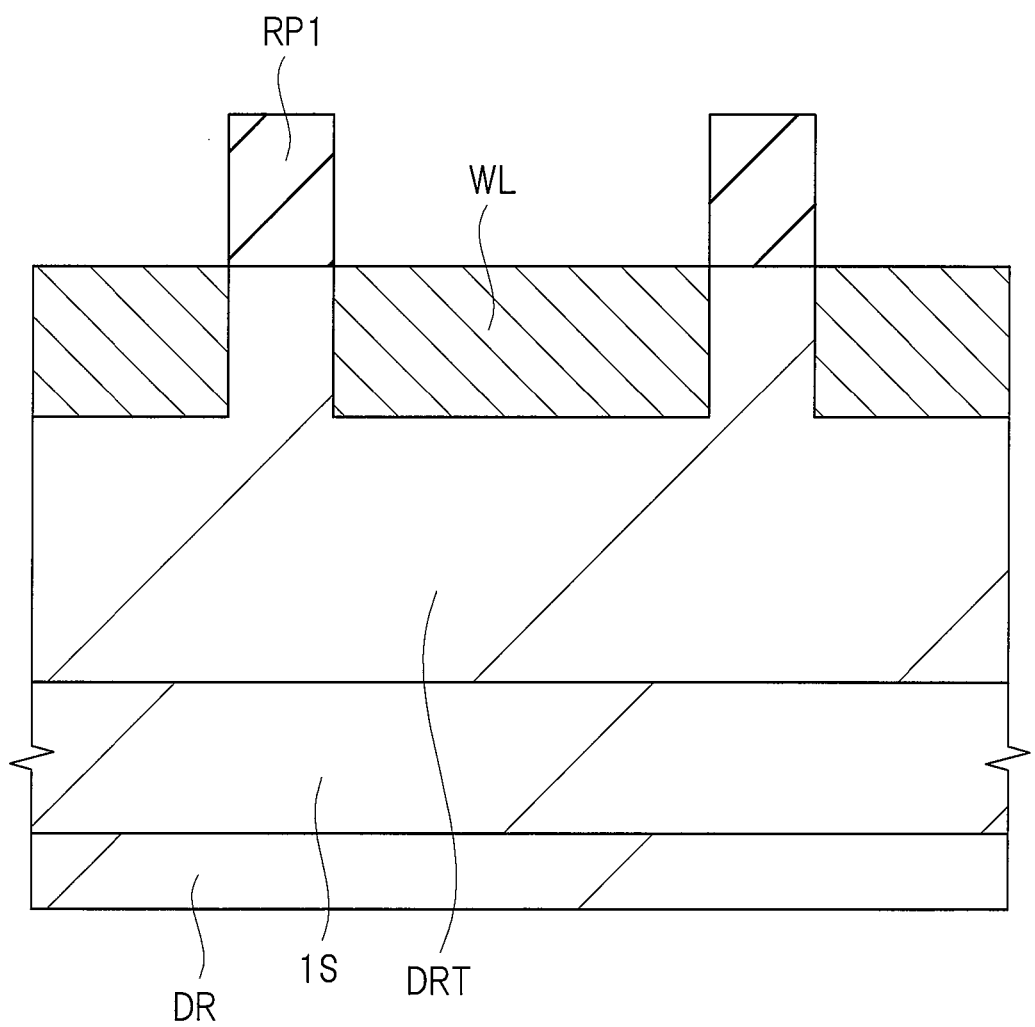
FIG. 6 is a cross-sectional view illustrating a manufacturing process of the SiC power MOSFET after FIG. 5.

Subsequently, a resist pattern RP1 is formed on the top surface of the $n^-$-type drift layer DRT as illustrated in FIG. 6. Subsequently, the p-type well region WL is formed in the $n^-$-type drift layer DRT by ion-implanting a p-type impurity, for example, an aluminum atom (Al) into the $n^-$-type drift layer DRT using the resist pattern RP1 as a mask. The depth of the p-type well region WL from the top surface of the drift layer DRT is about, for example, 0.5 μm to 2.0 μm. In addition, the impurity concentration of the p-type well region WL is within a range of, for example, $1 \times 10^{16}$ cm$^{-3}$ to $1 \times 10^{-9}$ cm$^{-3}$.

Figure 7:
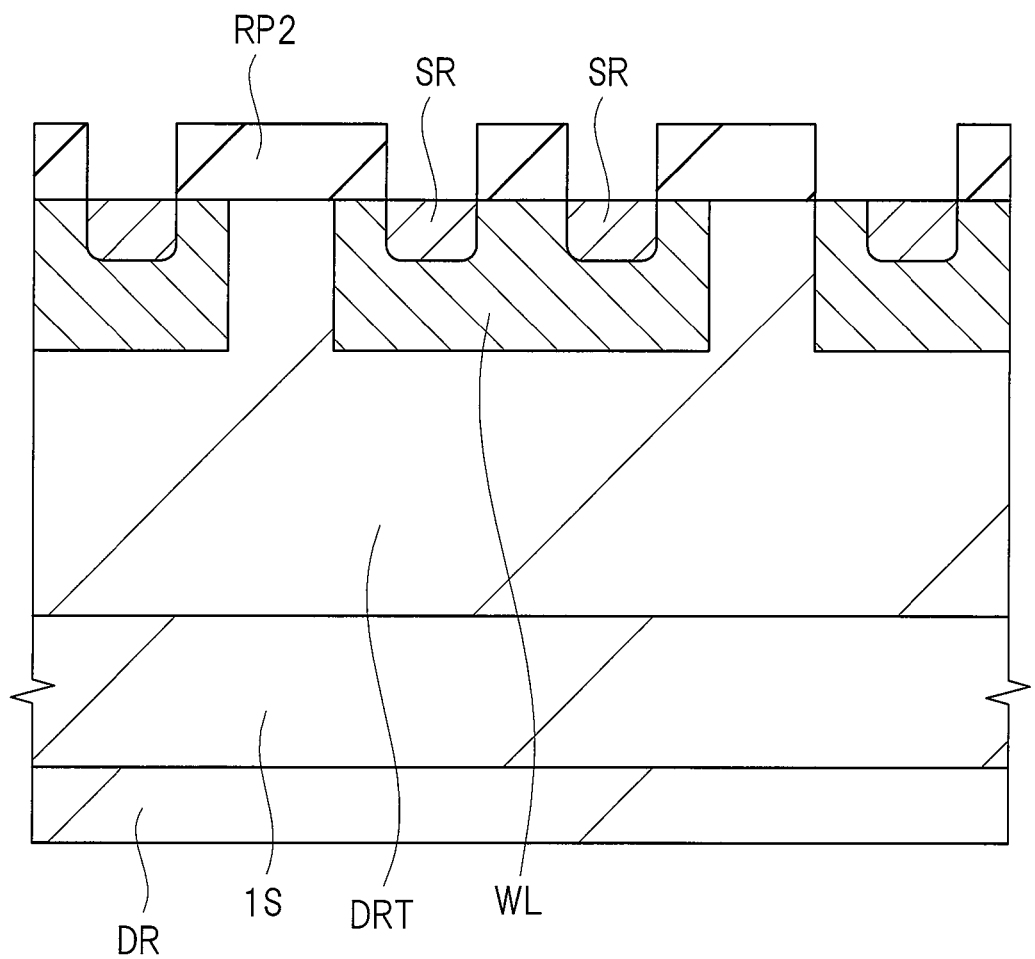
FIG. 7 is across-sectional view illustrating a manufacturing process of the SiC power MOSFET after FIG. 6.

Next, a resist pattern RP2 is formed on the top surface of the $n^-$-type drift layer DRT after removing the resist pattern RP1 as illustrated in FIG. 7. Subsequently, the $n^+$-type source region SR is formed in the p-type well region WL by ion-implanting the $n^-$-type impurity, for example, a nitrogen atom (N) or a phosphorus atom (P) into the p-type well region WL using the resist pattern RP2 as the mask. The depth of the $n^-$-type source region SR from the top surface of the drift layer DRT is about, for example, 0.1 μm to 0.4 μm.

The nitrogen atom (N) or the phosphorus atom (P) is exemplified as the $n^-$-type impurity to be ion-implanted into the p-type well region WL, but any $n^-$-type impurity, which allows an easy formation of a shallow junction so as to set the shallow depth of the $n^-$-type source region SR from the top surface of the drift layer DRT, may be used. For example, a nitrogen molecule ($N_2$), nitrogen fluoride (NF), nitrogen difluoride ($NF_2$), nitrogen trifluoride ($NF_3$), a phosphorous molecule ($P_2$), phosphine ($PH_3$), phosphorus fluoride (PF), phosphorus difluoride ($PF_2$), or phosphorus trifluoride ($PF_3$), or alternatively, a mixed gas of the above-described gas type may be used. Incidentally, the impurity concentration of the $n^+$-type source region SR is in a range of, for example, $1 \times 10^{17}$ cm$^{-3}$ to $1 \times 10^{21}$ cm$^{-3}$.

Figure 8:
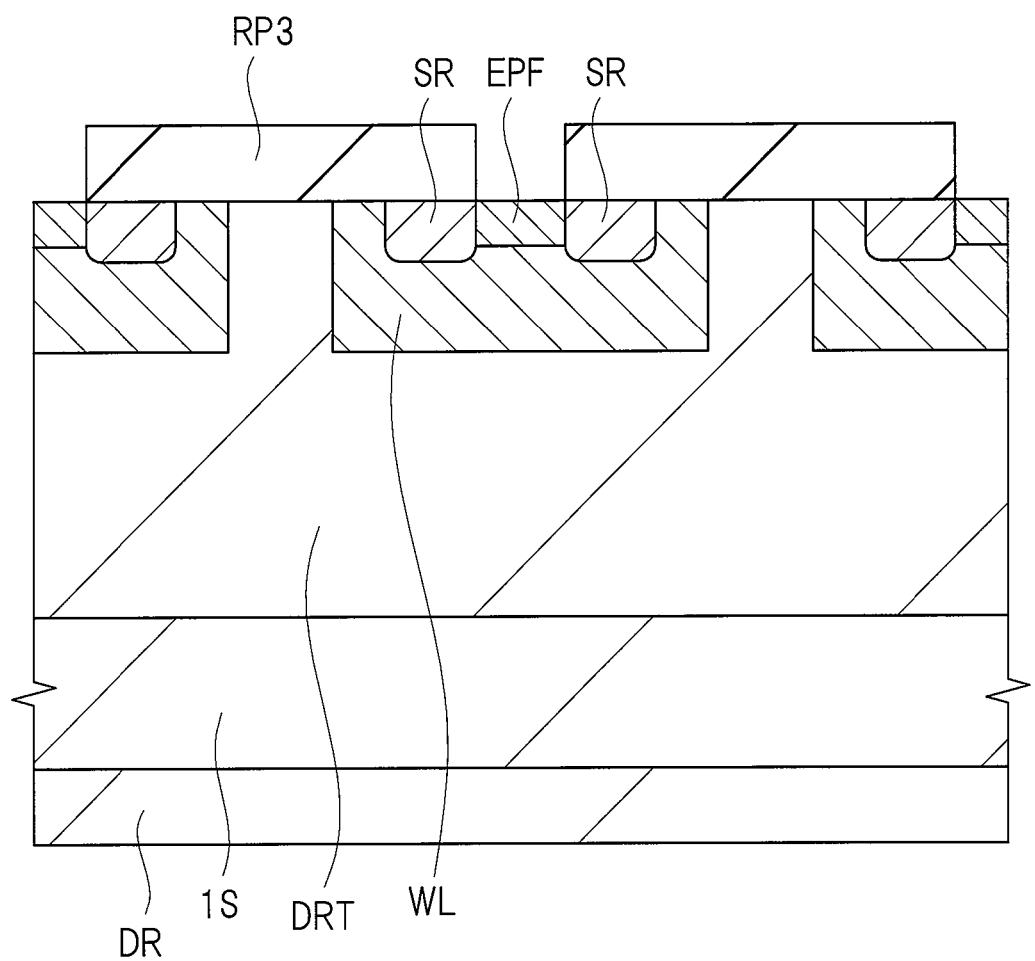
FIG. 8 is a cross-sectional view illustrating a manufacturing process of the SiC power MOSFET after FIG. 7.

Subsequently, a resist pattern RP3 is formed on the top surface of the $n^-$-type drift layer DRT after removing the resist pattern RP2 as illustrated in FIG. 8. The resist pattern RP3 is provided with an opening region only in a region in which the p$^{++}$-type potential fixing layer EPF is to be formed in the following step. Further, the p$^{++}$-type potential fixing layer EPF is formed in the p-type well region WL by ion-implanting the p-type impurity, for example, the aluminum atom (Al) into the p-type well region WL using the resist pattern RP3 as the mask.

The depth of the p$^{++}$-type potential fixing layer EPF from the top surface of the drift layer DRT is about, for example, 0.05 µm to 0.2 µm. The impurity concentration of the p$^{++}$-type potential fixing layer EPF is within a range of, for example, $1\times10^{19}$ cm$^{-3}$ to $1\times10^{21}$ cm$^{-3}$.

Figure 9:
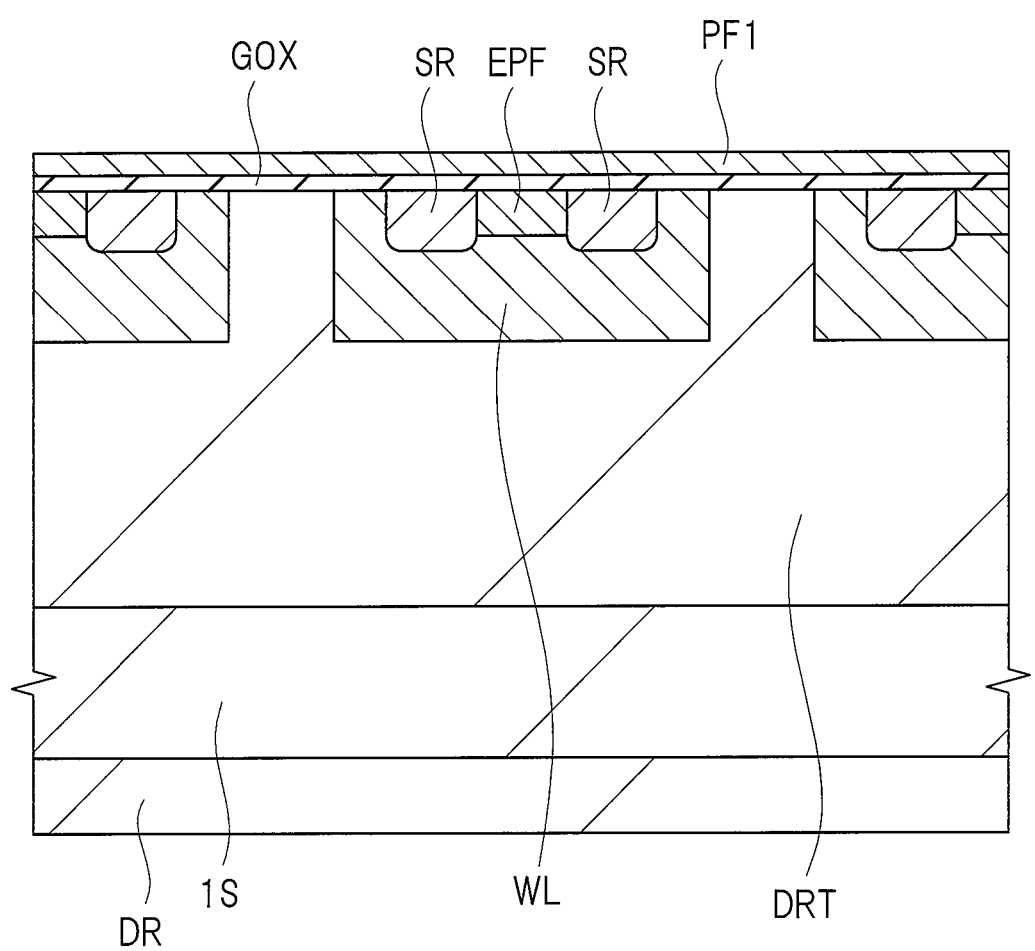
FIG. 9 is a cross-sectional view illustrating a manufacturing process of the SiC power MOSFET after FIG. 8.

Next, the gate insulating film GOX is formed on the top surface of the n$^-$-type drift layer DRT after removing the resist pattern RP3 as illustrated in FIG. 9. The gate insulating film GOX is made of, for example, the silicon oxide film (SiC$_2$ film), which is formed by thermally oxidizing the substrate 1S, or alternatively, of a silicon oxide film formed using a thermal CVD (Chemical Vapor Deposition) method, a silicon nitride film (SiN film), or a silicon oxynitride film (SiON film). The thickness of the gate insulating film GOX is about, for example, 0.01 µm to 0.10 µm.

Thereafter, the polycrystalline silicon film PF1 is formed on the gate insulating film GOX. The polycrystalline silicon film PF1 is formed by performing deposition to have the film thickness of equal to or smaller than 0.20 µm (200 nm) in a polycrystalline state using the CVD method, or performing deposition in the amorphous state using the CVD method, and then, annealing the resultant film at temperature of 700 to 900° C. to be crystallized. The conductivity type of the polycrystalline silicon film PF1 is, for example, the n$^+$-type. Here, since the polycrystalline silicon film PF1 has the film thickness of equal to or smaller than 200 nm in the first embodiment, it is possible to reduce the stress to be generated in the gate insulating film GOX due to the polycrystalline silicon film PF1. As a result, according to the first embodiment, it is possible to suppress the reduction in the reliability of the gate insulating film GOX.

Figure 10:
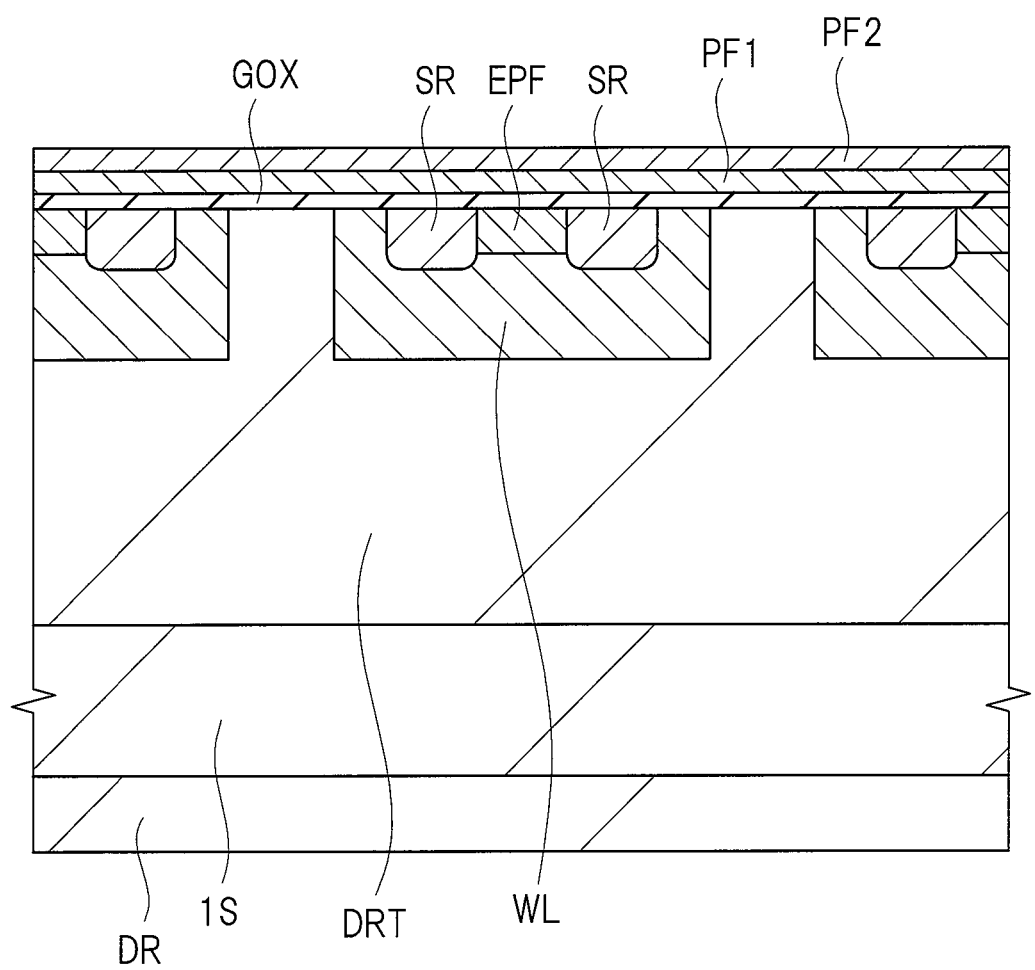
FIG. 10 is a cross-sectional view illustrating a manufacturing process of the SiC power MOSFET after FIG. 9.

Subsequently, as illustrated in FIG. 10, the polycrystalline silicon film PF2 is formed on the polycrystalline silicon film PF1. The thickness of the polycrystalline silicon film PF2 is determined from the viewpoint of the operational specification as a device, and is, for example, 0.03 µm to 0.5 µm. The polycrystalline silicon film PF2 is formed by performing deposition in the polycrystalline state using the CVD method, or performing deposition in the amorphous state using the CVD method, and then, annealing the resultant film at temperature of 700 to 900° C. to be crystallized. In addition, the conductivity type of the polycrystalline silicon film PF2 is, for example, the n$^+$-type.

Figure 11:
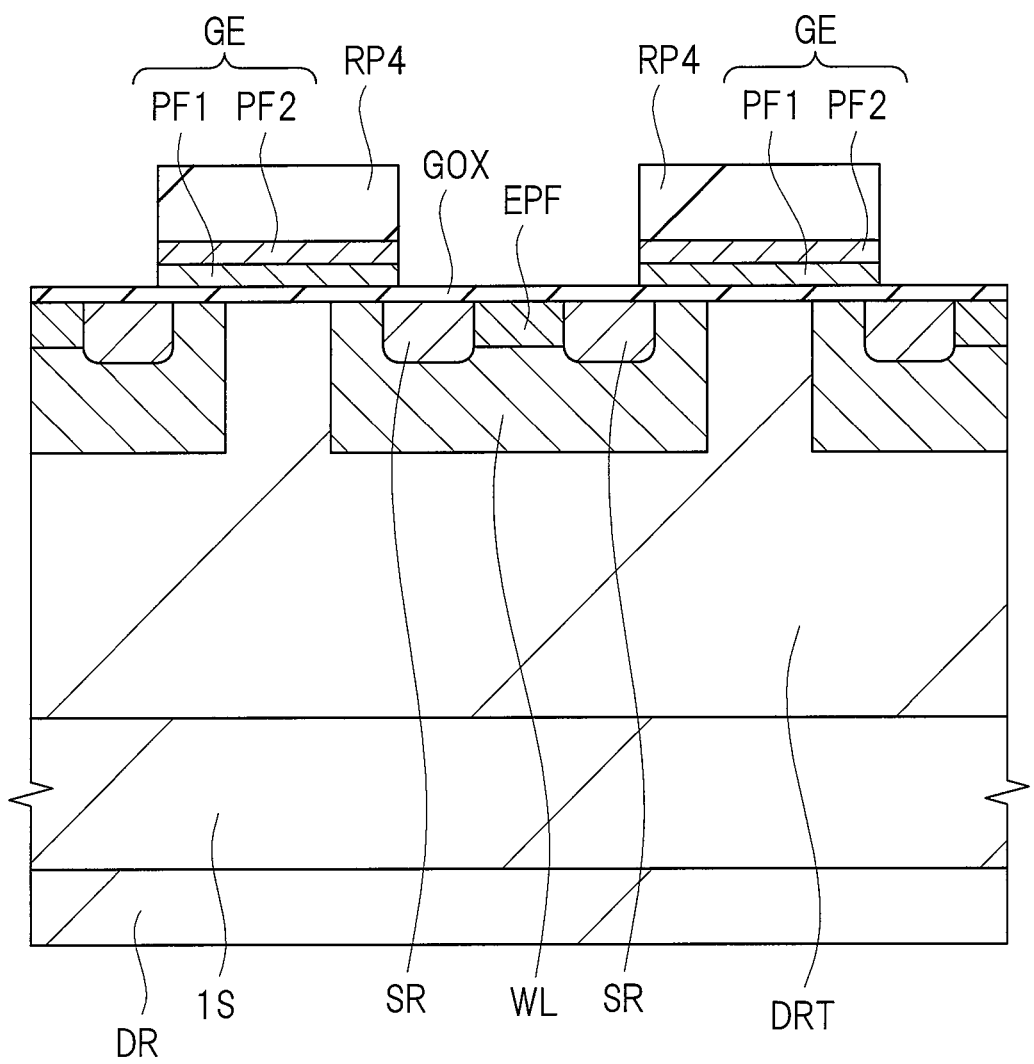
FIG. 11 is a cross-sectional view illustrating a manufacturing process of the SiC power MOSFET after FIG. 10.

Next, a resist pattern RP4 is formed on the polycrystalline silicon film PF2 as illustrated in FIG. 11. Further, the gate electrode GE formed of a laminated film of the polycrystalline silicon film PF1 and the polycrystalline silicon film PF2 is formed by sequentially processing the polycrystalline silicon film PF2 and the polycrystalline silicon film PF1 by a dry etching method using the resist pattern PR4 as the mask.

Figure 12:
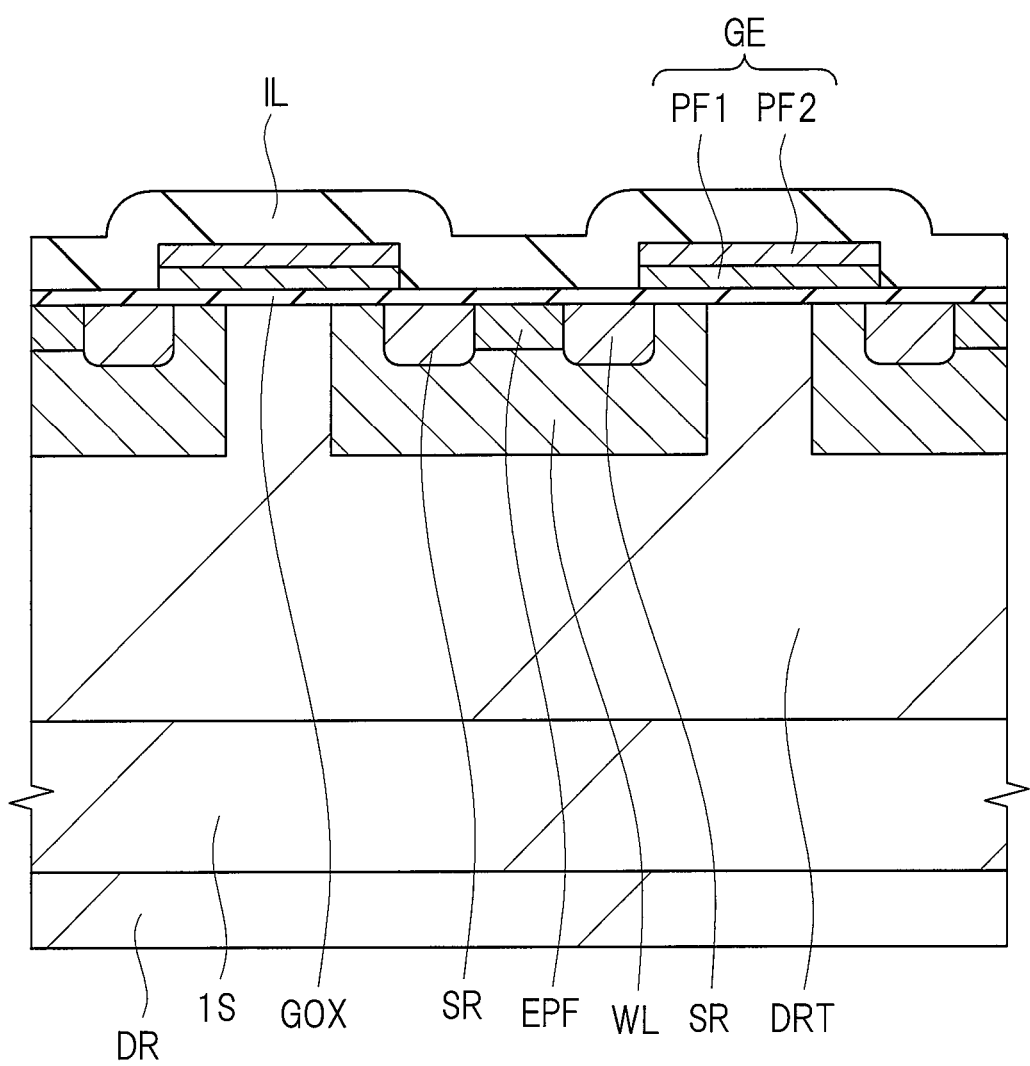
FIG. 12 is a cross-sectional view illustrating a manufacturing process of the SiC power MOSFET after FIG. 11.

Thereafter, the interlayer insulating film IL made of the silicon oxide film is formed on the too surface of the n$^-$-type drift layer DRT using for example, a plasma CVD method so as to cover the gate insulating film GOX and the gate electrode GE after removing the resist pattern RP4 as illustrated in FIG. 12.

Figure 13:
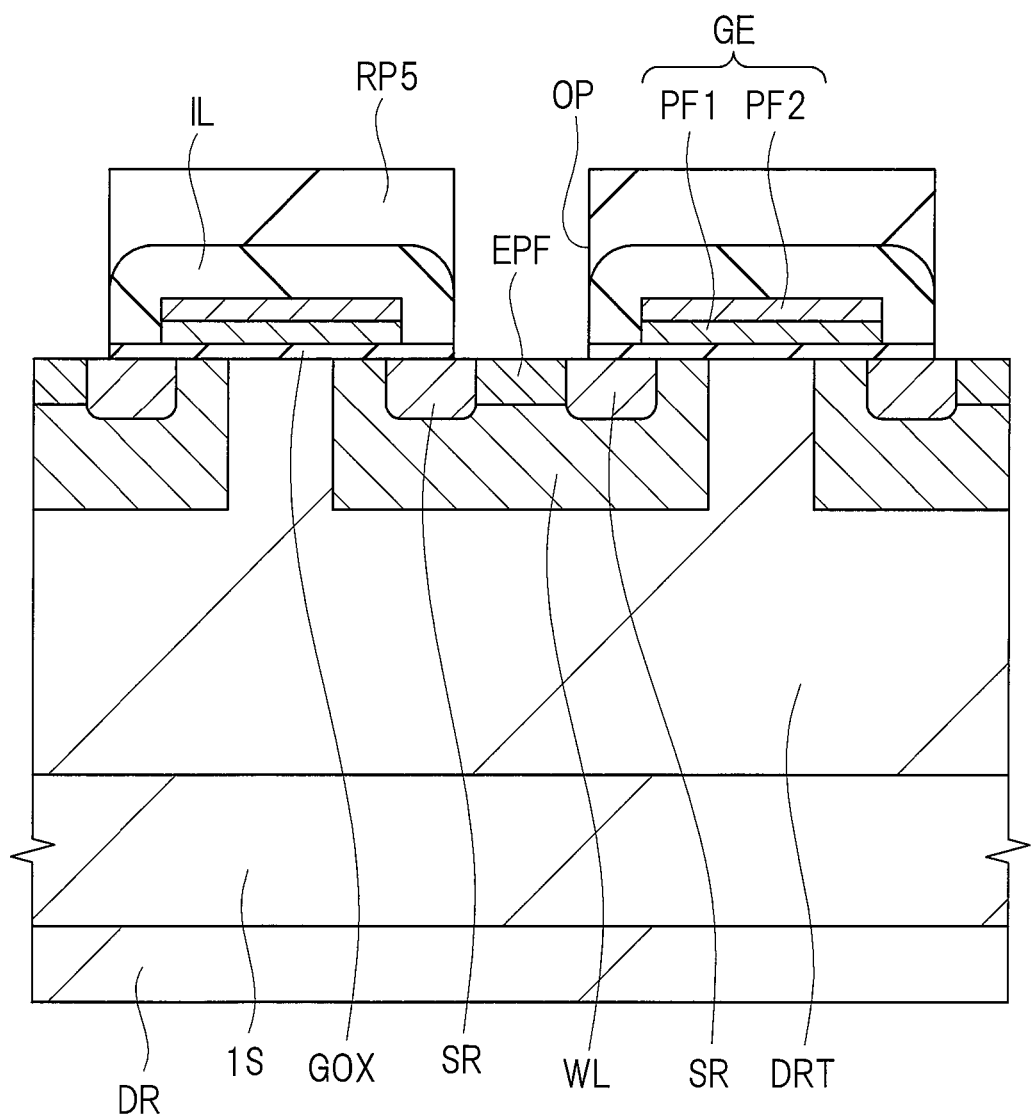
FIG. 13 is a cross-sectional view illustrating a manufacturing process of the SiC power MOSFET after FIG. 12.

Subsequently, a resist pattern RP5 is formed on the interlayer insulating film IL as illustrated in FIG. 13. Further, the opening portion OP that reaches the part of the n$^+$-type source region SR and the p$^{++}$-type potential fixing layer EPF is formed by processing the interlayer insulating film IL and the gate insulating film GOX by the dry etching method using the resist pattern RP5 as the mask.

Figure 14:
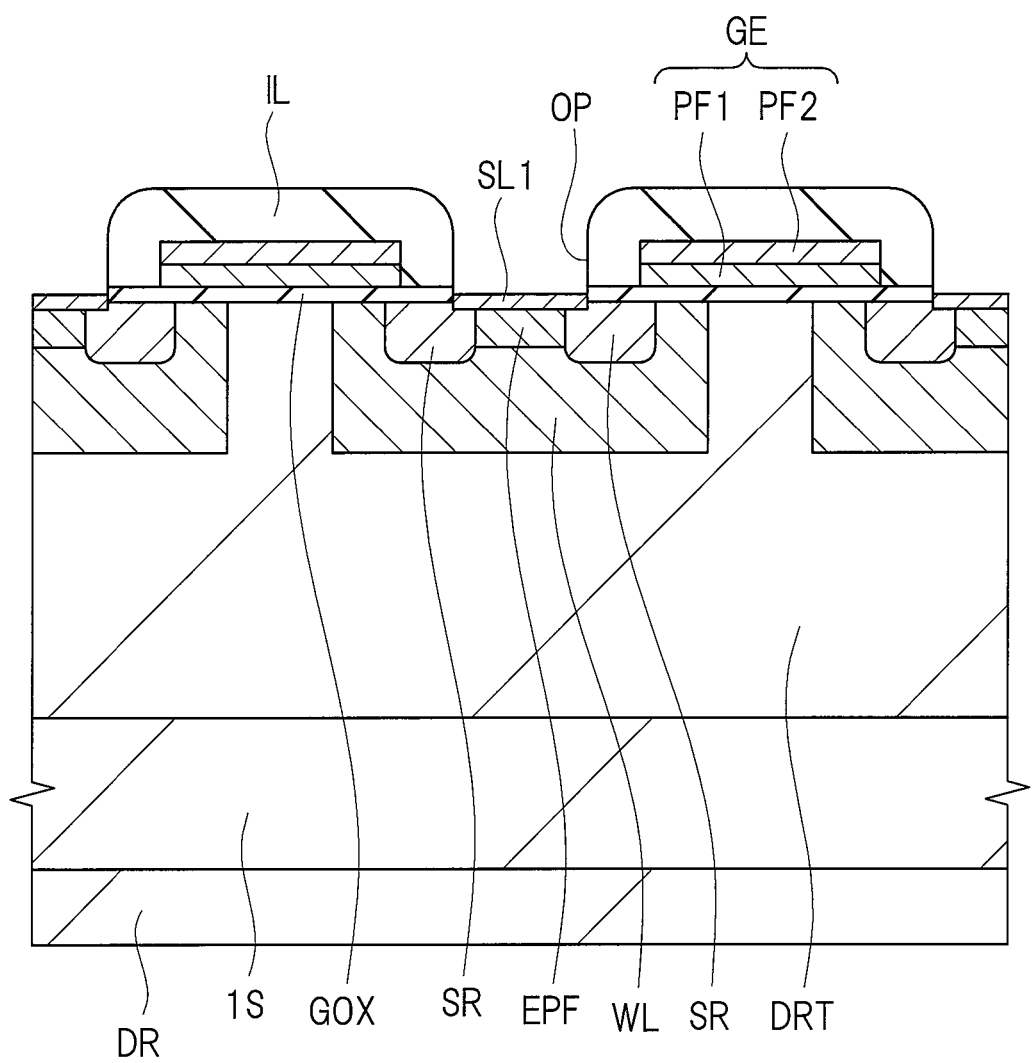
FIG. 14 is a cross-sectional view illustrating a manufacturing process of the SiC power MOSFET after FIG. 13.

Next, the metal silicide layer SL1 is formed on each top surface of the part of the n$^+$-type source region SR and the p$^{++}$-type potential fixing layer EPF which are exposed to the bottom surface of the opening portion OP after removing the resist pattern RP5 as illustrated in FIG. 14.

In the step of forming the metal silicide layer SL1, a first metal film, made of a nickel film (Ni film) is first deposited the top surface of the n$^-$-type drift layer DRT using, for example, a sputtering method so as to cover the inside (side surfaces and the bottom surface) of the interlayer insulating film IL and the opening portion OP, although not illustrated. A thickness of the first metal film is about, for example, 0.05 µm. Thereafter, the first metal film and the n$^-$-type drift layer DRT are caused to react with each other in the bottom surface of the opening portion OP by performing heat treatment at 500 to 900° C., for example, and the metal silicide layer SL1 made of a nickel silicide layer (NiSi layer) is formed on each top surface of the part of the n$^+$-type source region SR and the p$^{++}$-type potential fixing layer EPF which are exposed to the bottom surface of the opening portion OP. Further, an unreacted part of the first metal film is removed by a wet etching method. For example, sulfuric acid/hydrogen peroxide is used in the wet etching method.

Subsequently, a second metal film is deposited on the rear surface of the substrate 1S using, for example, the sputtering method although not illustrated. A thickness of the second metal film is about, for example, 0.1 µm.

Figure 15:
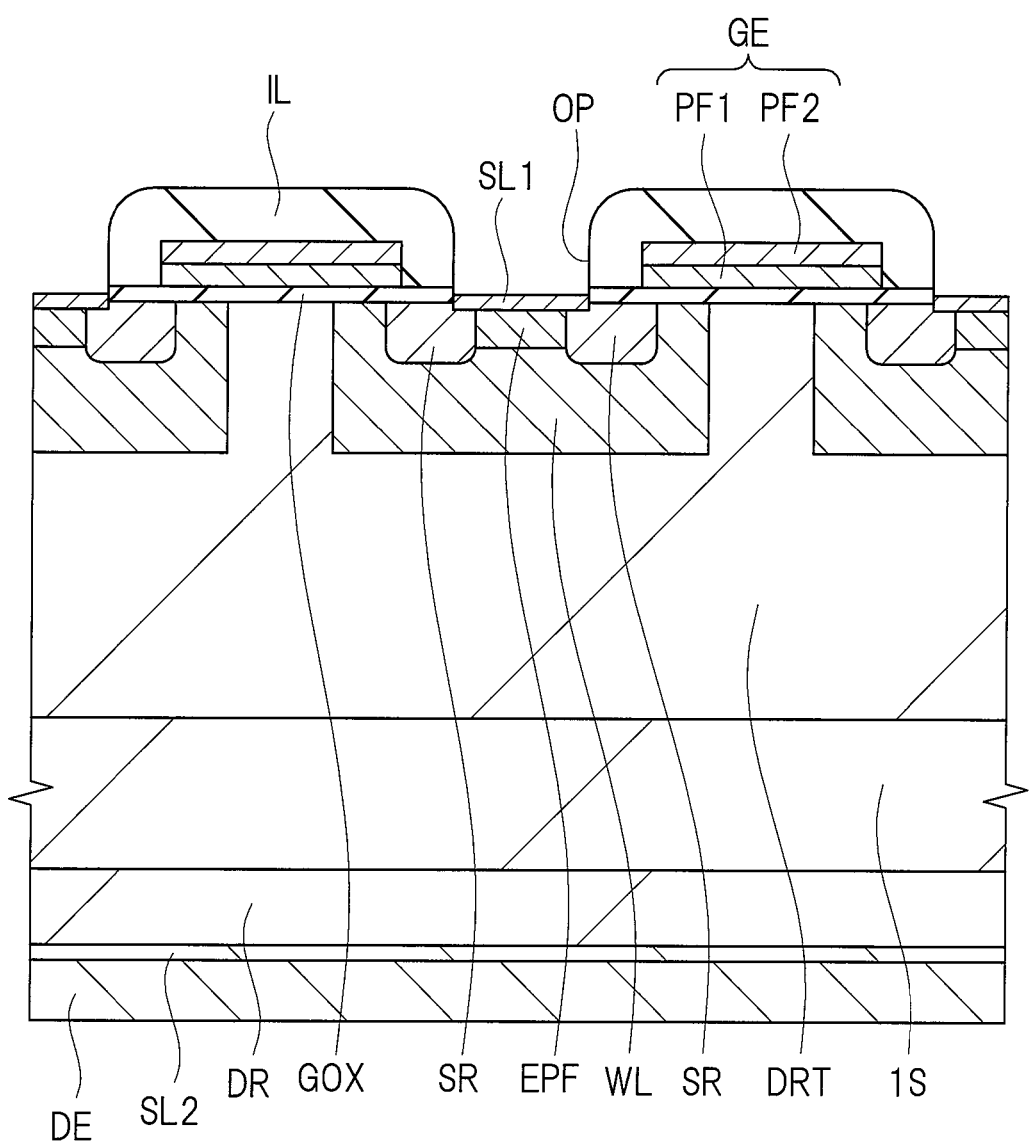
FIG. 15 is a cross-sectional view illustrating a manufacturing process of the SiC power MOSFET after FIG. 14.

Further, the second metal film and the substrate 1S are caused to react with each other by performing the heat treatment at 800 to 1200° C., and the metal silicide layer SL2 is formed so as to cover the n$^+$-type drain region DR formed on the rear surface side of the substrate 1S as illustrated in FIG. 15. Thereafter, the drain electrode DE is formed so as to cover the metal silicide layer SL2. A thickness of the drain electrode DE is about, for example, 0.4 µm.

Next, the interlayer insulating film IL is processed by the dry etching method using a resist pattern as the mask, and an opening portion that reaches the gate electrode GE is formed although not illustrated.

Further, as illustrated in FIG. 1, a third metal film is deposited on the interlayer insulating film IL including the inside of the opening portion OP that reaches the metal silicide layer SL1 formed on each top surface of the part of the n$^+$-type source region SR and the p$^{++}$-type potential fixing layer EPF and the opening portion (not illustrated) which reaches the gate electrode GE. The third metal film is formed using a laminated film of, for example, a titanium film (Ti film), a titanium nitride film (TiN film) and an aluminum film (Al film). It is desirable that a thickness of the aluminum film be, for example, equal to or larger than 2.0 µm. Subsequently, the source electrode SE, which is electrically connected to the part of the n$^+$-type source region SR via the metal silicide layer SL1, and a gate electrode wiring (not illustrated), which is electrically connected to the gate electrode GE, are formed by processing the third metal film. Thereafter, an external wiring is electrically connected to each of the gate electrode GE, the source electrode SE, and the drain electrode DE.

In this manner, according to the first embodiment, it is possible to achieve the gate electrode resistance required from the viewpoint of the device operation while suppressing the "extrinsic breakdown density" in the SiC power MOSFET using the silicon carbide, as much as in the Si power MOSFET, by forming the gate electrode GE with the two layers, that is, the polycrystalline silicon film PF1 of equal to or smaller than 200 nm as the damage suppressing layer, and the polycrystalline silicon film PF2 having the film thickness determined by the specification of the gate electrode resistance.

(Second Embodiment)

A point different from the first embodiment is that a metal silicide layer SL3 is employed instead of the polycrystalline silicon film PF2.

<Configuration of SiC Power MOSFET>

Figure 16:
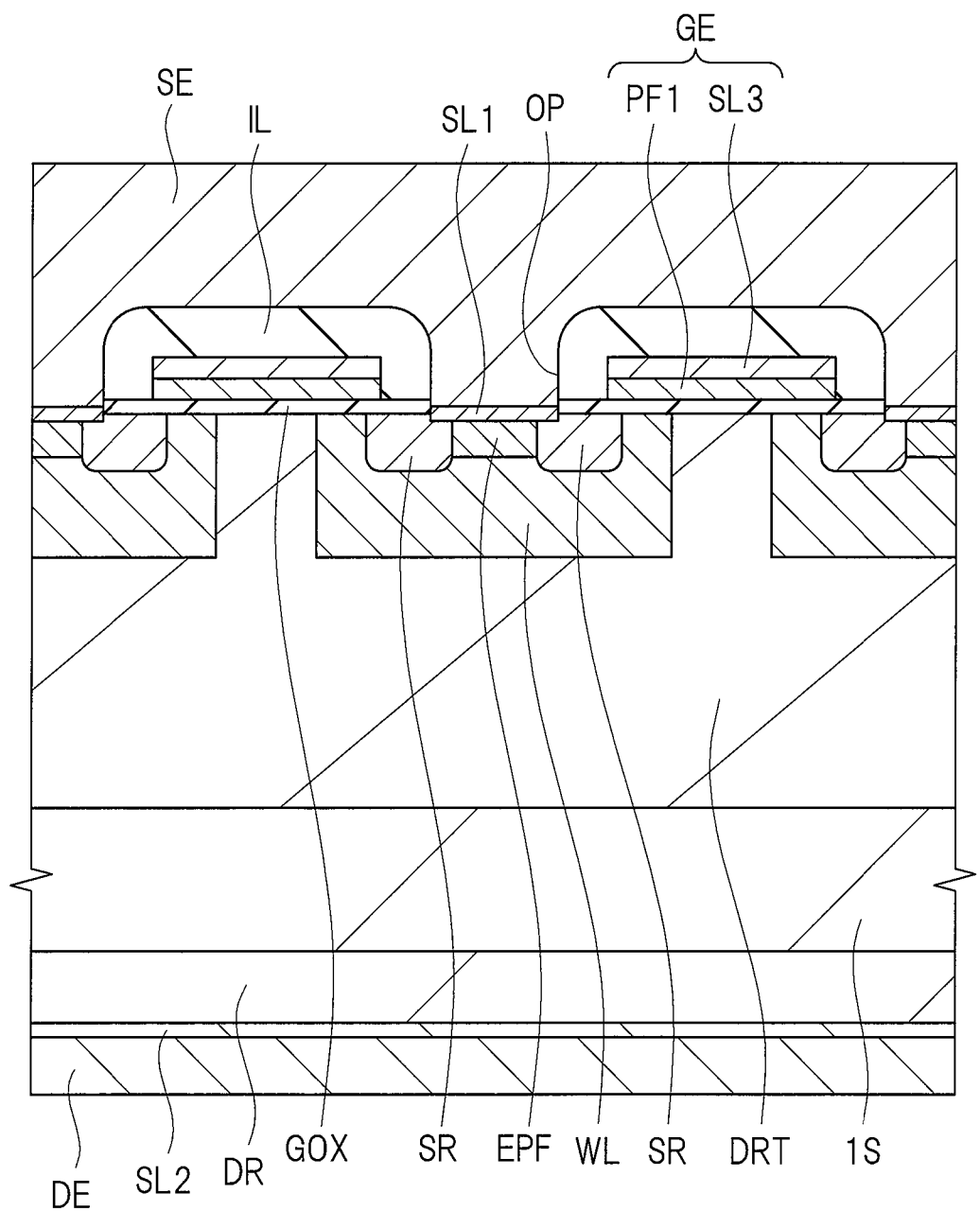
FIG. 16 is a cross-sectional view illustrating a configuration of the SiC power MOSFET according to a second embodiment.

A description will be made regarding a structure of an n-channel SiC power MOSFET configuring a wide-bandgap semiconductor device according to a second embodiment. FIG. 16 is a cross-sectional view of main parts of the SiC power MOSFET according to the second embodiment.

As illustrated in FIG. 16, a configuration except for a configuration of the gate electrode GE is the same as the configuration of the SiC power MOSFET according to the above-described first embodiment illustrated in FIG. 1 in a top surface and a rear surface of an n$^+$-type substrate 1S made of the silicon carbide.

The gate electrode GE is formed of the polycrystalline silicon film PF1 and the metal silicide layer SL3. The polycrystalline silicon film PF1 illustrated in FIG. 16 is a film formed to have the film thickness of equal to or smaller than 200 nm similarly to the polycrystalline silicon film PF1 described in the first embodiment, and an effect of the polycrystalline silicon film PF1 according to the second embodiment is the same as that in the case of the first embodiment. That is, it is possible to suppress the "extrinsic breakdown density" to the level close to that of the Si power MOSFET as illustrated in FIG. 2 by forming the polycrystalline silicon film PF1 having the film thickness of equal to or smaller than 200 nm in contact with the gate insulating film GOX. However, when the gate electrode GE is formed using only the polycrystalline silicon film PF1, there are some cases where it is difficult to reduce the gate electrode resistance to the level required from the viewpoint of the device operation because there is an upper limit in the film thickness as 200 nm, that is, there is a lower limit in the sheet resistance of the gate electrode GE. Thus, the polycrystalline silicon film PF2 is additionally formed on the polycrystalline silicon film PF1 so as to reduce the gate electrode resistance in the first embodiment. With respect to this, in the second embodiment, the desired gate electrode resistance is achieved by forming the metal silicide layer SL, instead of the polycrystalline silicon film PF2, on the polycrystalline silicon film PF1.

In particular, the metal silicide layer SL3 having a lower resistivity than the polycrystalline silicon film PF2 is used as the resistance reducing layer of the gate electrode GE in the second embodiment, and thus, it is possible to reduce the film thickness of the metal silicide layer SL3 to be thinner than the film thickness of the polycrystalline silicon film PF2 in the case of obtaining the same gate electrode resistance. This means that a height of the gate electrode GE is lowered in FIG. 16, and accordingly, it is possible to suppress an aspect ratio of the opening portion OP to be low. As a result, the aspect ratio of the opening portion OP does not increase even when a distance between the gate electrodes GE is narrowed, and thus, it is possible to improve ease of processability. This means that it is possible to improve a device density according to the SiC power MOSFET of the second embodiment. Therefore, according to the second embodiment, it is possible to obtain the same effect as that of the first embodiment, and further, it is also possible to achieve downsizing of the semiconductor device.

<Method of Manufacturing SiC Power MOSFET>

The SiC power MOSFET according to the second embodiment is configured as described above, and a method of manufacturing the same will be described hereinafter with reference to the drawings.

Figure 17:
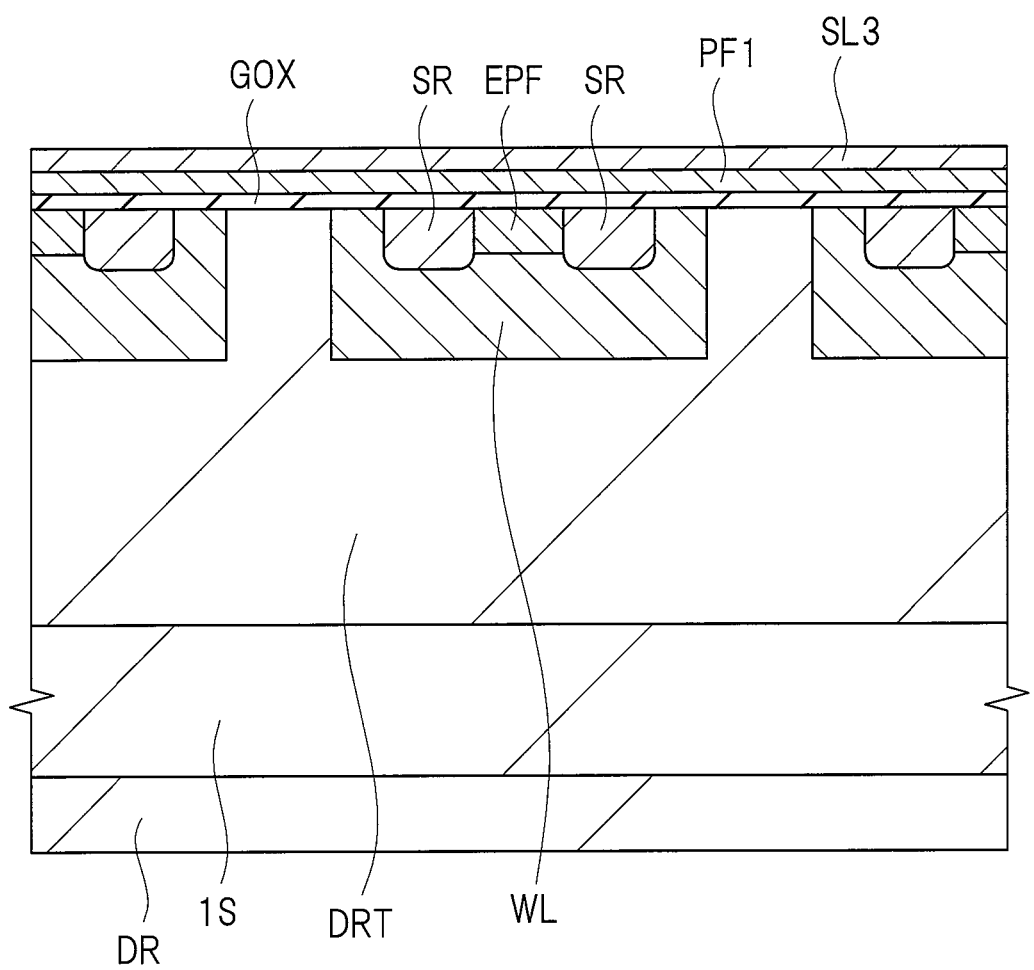
FIG. 17 is a cross-sectional view illustrating a manufacturing process of the SiC power MOSFET according to the second embodiment.

First, steps until FIG. 17 are the same as the content described with reference to FIGS. 5 to 9 in the first embodiment. That is, in the steps until FIG. 17, the polycrystalline silicon film PF1 having the film thickness of equal to or smaller than 200 nm is deposited across the entire top surface of the substrate (wafer) 1S as illustrated in FIG. 9.

Next, a fourth metal film made of, for example, the nickel film is deposited on the top surface of the polycrystalline silicon film PF1 using, for example, the sputtering method as illustrated in FIG. 17. A thickness of the fourth metal film is about, for example, 0.05 μm. Subsequently, the fourth metal film and the polycrystalline silicon film PF1 are caused to react with each other across the entire surface on the polycrystalline silicon film PF1 by performing the heat treatment at 500 to 900° C., thereby forming the metal silicide layer SL3.

Figure 18:
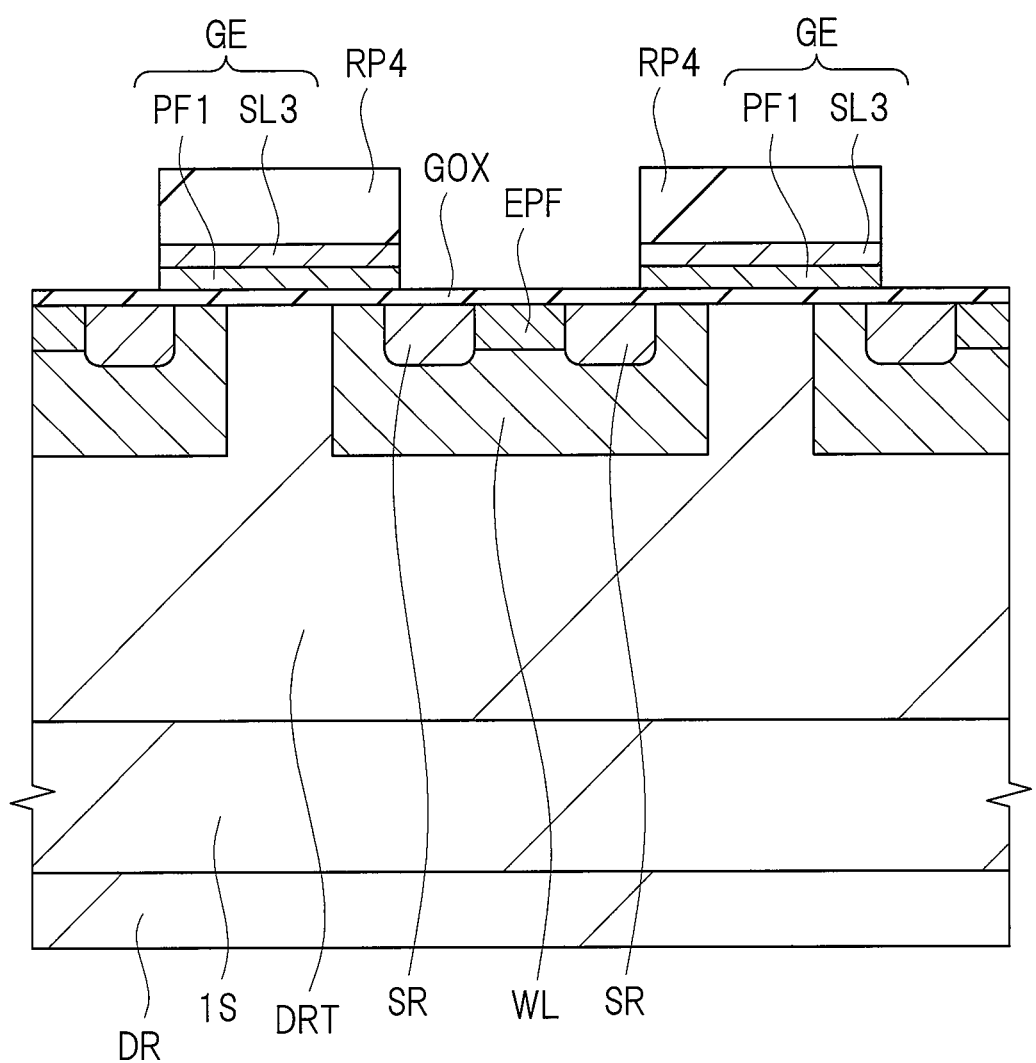
FIG. 18 is a cross-sectional view illustrating a manufacturing process of the SiC power MOSFET after FIG. 17.

Further, the resist pattern RP4 is formed on the metal silicide layer SL3 as illustrated in FIG. 18. Thereafter, the gate electrode GE formed of the laminated film of the polycrystalline silicon film PF1 and the metal silicide layer SL3 is formed by processing the polycrystalline silicon film PF1 and the metal silicide layer SL3 by the dry etching method using the resist pattern PR4 as the mask.

The subsequent steps are the same steps of forming the interlayer insulating film IL, the opening portion OP, the metal silicide layer SL1, the source electrode SE, the metal silicide layer SL2, and the drain electrode DE according to the above-described first embodiment, and these components are formed also in the second embodiment. Thereafter, the external wiring is electrically connected to each of the gate electrode GE, the source electrode SE, and the drain electrode DE.

In this manner, according to the second embodiment, the gate electrode GE is formed with the two layers, that is, the polycrystalline silicon film PF1 having the film thickness of equal to or smaller than 200 nm is formed as the damage suppressing layer, and the metal silicide layer SL3 is formed by the silicide reaction on the upper surface of the polycrystalline silicon film PF1 as the resistance reducing layer in the SiC power MOSFET using the silicon carbide. Accordingly, it is possible to achieve the gate electrode resistance required from the viewpoint of the device operation while suppressing the "extrinsic breakdown density", as much as in the Si power MOSFET, also in the SiC power MOSFET according to the second embodiment.

(Third Embodiment)

A point different from the first embodiment is that a metal film MF is employed instead of the polycrystalline silicon film PF2.

<Configuration of SiC Power MOSSES>

Figure 19:
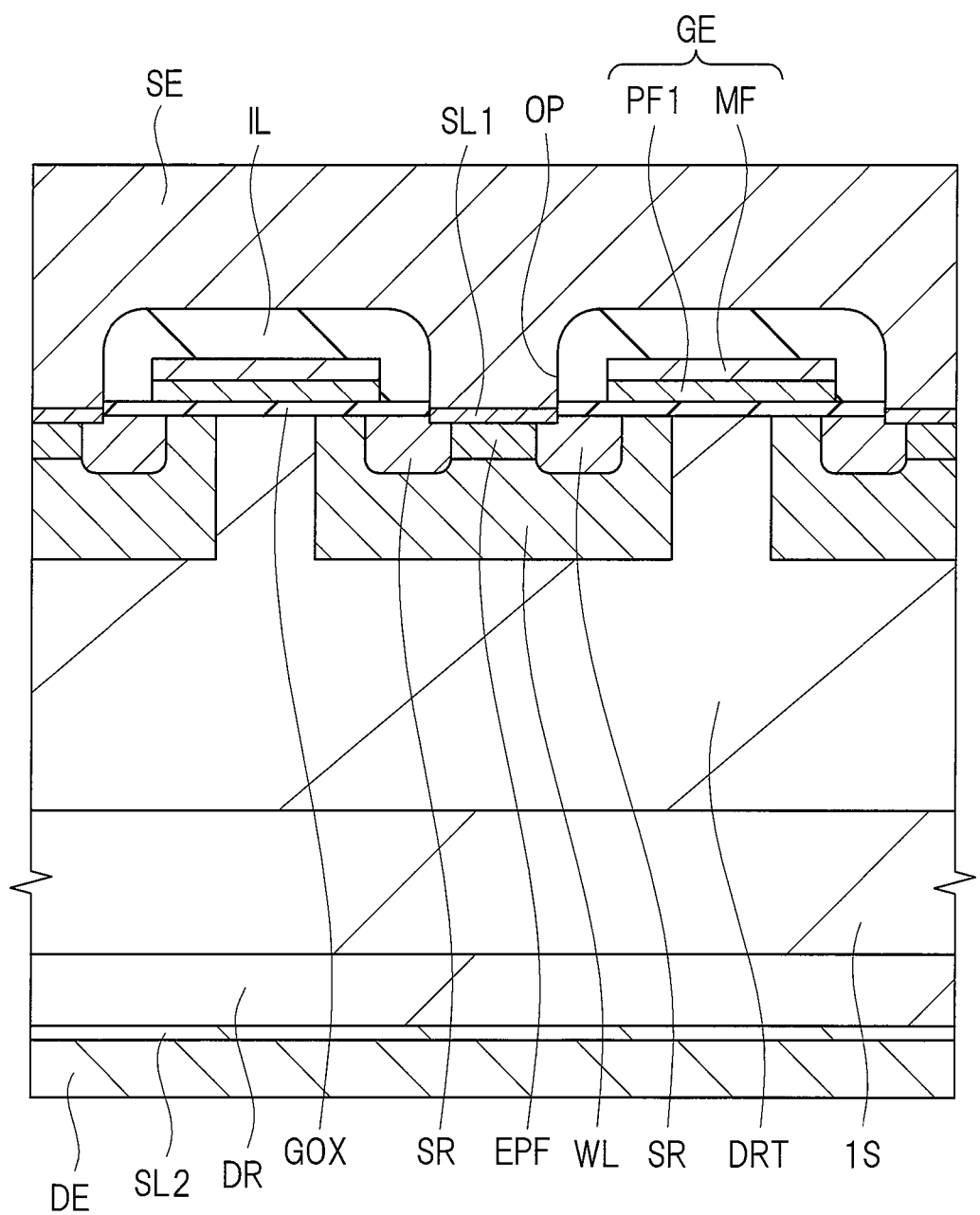
FIG. 19 is a cross-sectional view illustrating a configuration of the SiC power MOSFET according to a third embodiment.

A description will be made regarding a structure of an n-channel SiC power MOSFET configuring a wide-bandgap semiconductor device according to a third embodiment. FIG. 19 is a cross-sectional view of main parts of the SiC power MOSFET according to the third embodiment.

As illustrated in FIG. 19, a configuration except for a configuration of the gate electrode GE is the same as the configuration of the SiC power MOSFET according to the above-described first embodiment illustrated in FIG. 1 in a top surface and a rear surface of an n$^+$-type substrate 1S made of the silicon carbide.

The gate electrode GE is formed of the polycrystalline silicon film PF1 and the metal film MF. The polycrystalline silicon film PF1 illustrated in FIG. 19 is a film formed to have the film thickness of equal to or smaller than 200 nm similarly to the polycrystalline silicon film PF1 described in the first embodiment, and an effect of the polycrystalline silicon film PF1 according to the third embodiment is the same as that in the case of the first embodiment. That is, it is possible to suppress the "extrinsic breakdown density" to the level close to that of the Si power MOSFET as illustrated in FIG. 2 by forming the polycrystalline silicon film PF1 having the film thickness of equal to or smaller than 200 nm in contact with the gate insulating film GOX. However, when the gate electrode GE is formed using only the polycrystalline silicon film PF1, there are some cases where it is difficult to reduce the gate electrode resistance to the level required from the viewpoint of the device operation because there is an upper limit in the film thickness as 200 nm, that is, there is a lower limit in the sheet resistance of the gate electrode GE. Thus, the polycrystalline silicon film PF2 is additionally formed on the polycrystalline silicon film PF1 so as to reduce the gate electrode resistance in the first embodiment. With respect to this, in the third embodiment, the desired gate electrode resistance is achieved by forming the metal film MF, instead of the polycrystalline silicon film PF2, on the polycrystalline silicon film PF1.

In particular, since the metal film MF having a lower resistivity than the polycrystalline silicon film PF2 is used as the resistance reducing layer of the gate electrode GE also in the third embodiment, it is possible to reduce the film thickness of the metal film MF to be thinner than the film thickness of the polycrystalline silicon film PF2 in the case of obtaining the same gate electrode resistance. This means that a height of the gate electrode GE is lowered in FIG. 19, and accordingly, it is possible to suppress an aspect ratio of the opening portion OP to be low. As a result, the aspect ratio of the opening portion OP does not increase even when a distance between the gate electrodes GE is narrowed, and thus, it is possible to improve the ease of processability. This means that it is possible to improve the device density according to the SiC power MOSFET of the third embodiment. Therefore, according to the third embodiment, it is possible to obtain the same effect as that of the first embodiment, and further, it is also possible to achieve the downsizing of the semiconductor device.

<Method of Manufacturing SiC Power MOSFET>

The SiC power MOSFET according to the third embodiment is configured as described above, and a method of manufacturing the same will be described hereinafter with reference to the drawings.

Figure 20:
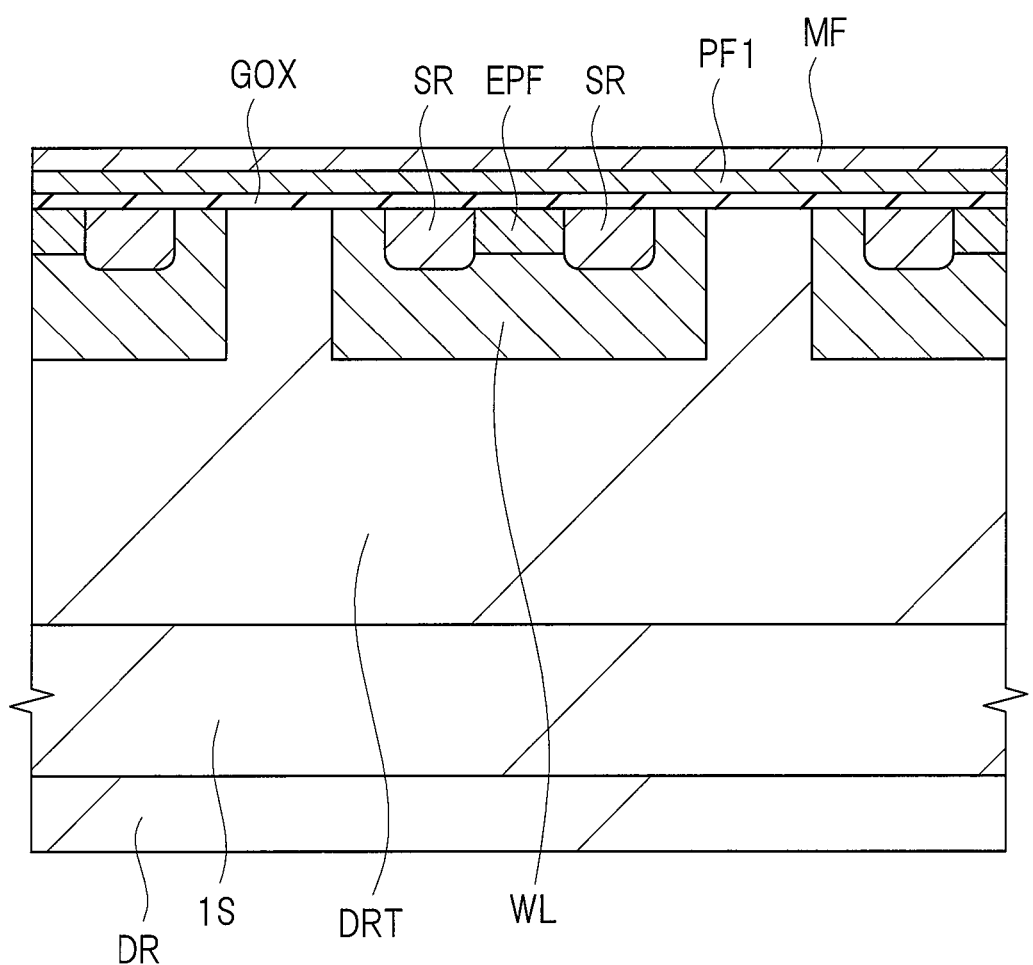
FIG. 20 is a cross-sectional view illustrating a manufacturing process of the SiC power MOSFET according to the third embodiment.

First, steps until FIG. 20 are the same as the content described with reference to FIGS. 5 to 9 in the first embodiment. That is, in the steps until FIG. 20, the polycrystalline silicon film PF1 having the film thickness of equal to or smaller than 200 nm is deposited across the entire top surface of the substrate (wafer) 1S as illustrated in FIG. 9.

Next, a fifth metal film made of, for example, the aluminum film is deposited on the top surface of the polycrystalline silicon film PF1 using, for example, the sputtering method as illustrated in FIG. 20. A thickness of the fourth metal film is about, for example, 0.05 μm to 0.2 μm.

Figure 21:
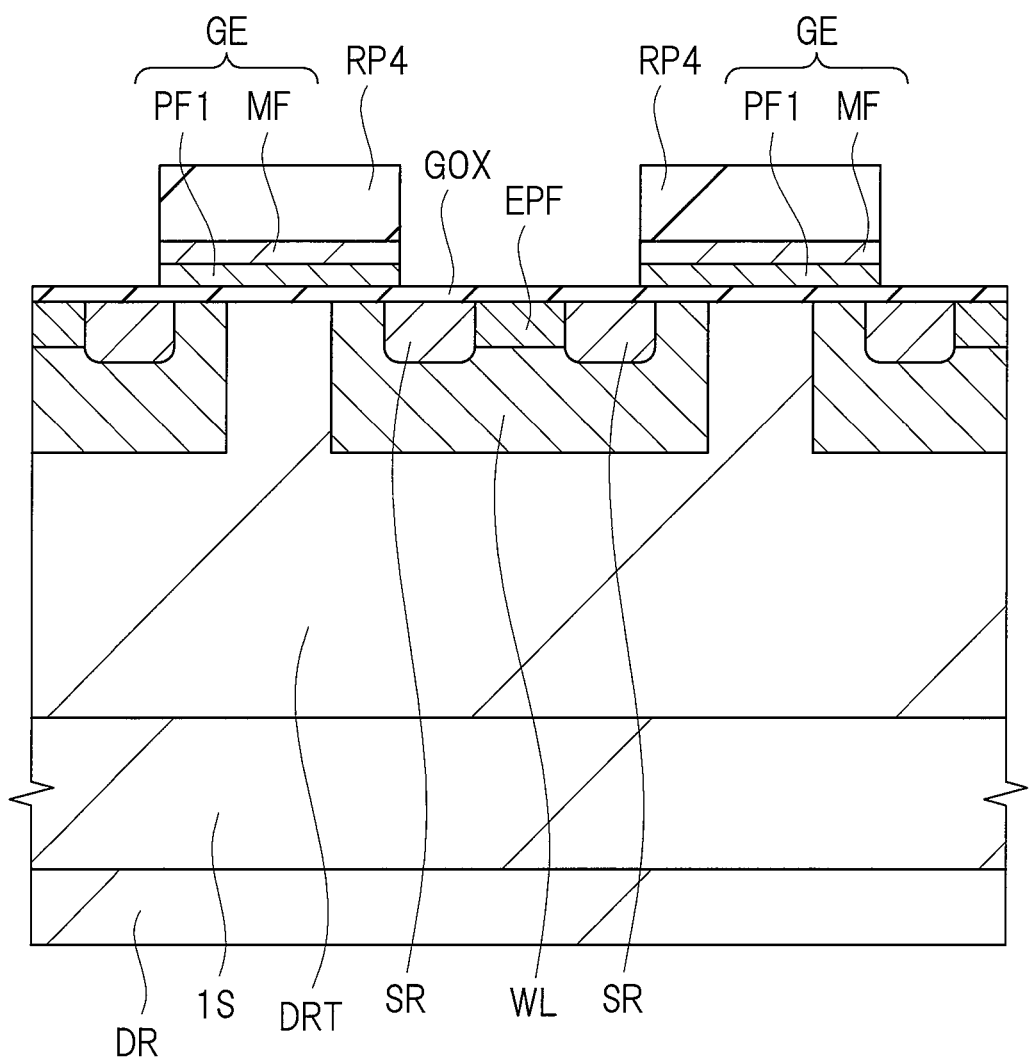
FIG. 21 is a cross-sectional view illustrating a manufacturing process of the SiC power MOSFET after FIG. 20.

Further, the resist pattern RP4 is formed on the metal film MF as illustrated in FIG. 21. Thereafter, the gate electrode GE formed of the laminated film of the polycrystalline silicon film PF1 and the metal film MF is formed by processing the polycrystalline silicon film PF1 and the metal film MF by the dry etching method using the resist pattern PR4 as the mask.

The subsequent steps are the same steps of forming the interlayer insulating film IL, the opening portion OP, the metal silicide layer SL1, the source electrode SE, the metal silicide layer SL2, and the drain electrode DE according to the above-described first embodiment, and these components are formed also in the third embodiment. Thereafter, the external wiring is electrically connected to each of the gate electrode GE, the source electrode SE, and the drain electrode DE.

In this manner, according to the third embodiment, the gate electrode GE is formed with the two layers, that is, the polycrystalline silicon film PF1 having the film thickness of equal to or smaller than 200 nm is formed as the damage suppressing layer, and the metal film MF is formed as the resistance reducing layer in the SiC power MOSFET using the silicon carbide. Accordingly, it is possible to achieve the gate electrode resistance required from the viewpoint of the device operation while suppressing the "extrinsic breakdown density", as much as in the Si power MOSFET, also in the SiC power MOSFET according to the third embodiment.

(Fourth Embodiment)

A point different from the first embodiment is that a laminated film of the metal silicide layer SL3 and the metal film ME is employed instead of the polycrystalline silicon film PF2.

<Configuration of SiC power MOSFET>

Figure 22:
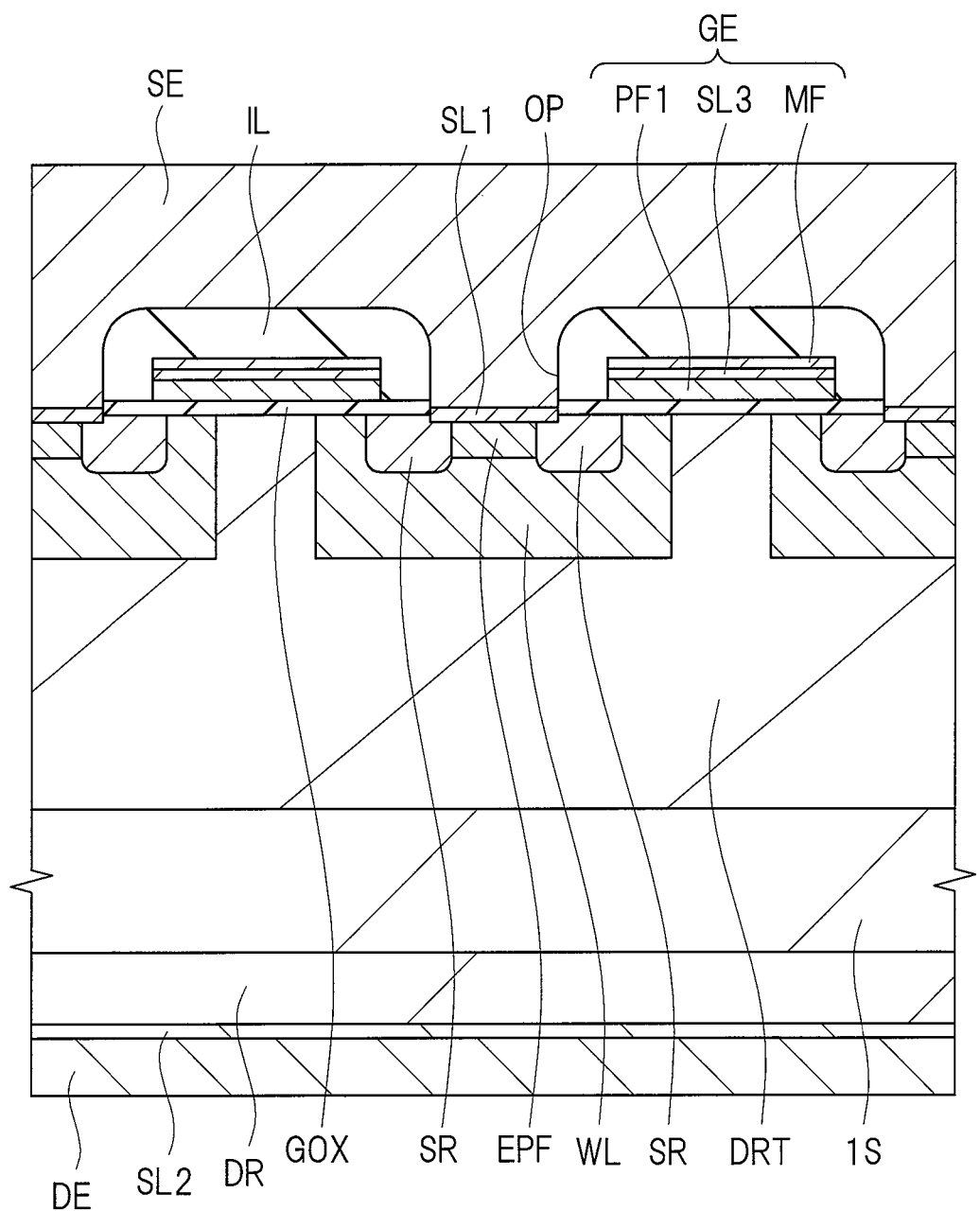
FIG. 22 is a cross-sectional view illustrating a configuration of the SiC power MOSFET according to a fourth embodiment.

A description will be made regarding a structure of an n-channel SiC power MOSFET configuring a wide-bandgap semiconductor device according to a fourth embodiment. FIG. 22 is a cross-sectional view of main parts of the SiC power MOSFET according to the fourth embodiment.

As illustrated in FIG. 22, a configuration except for a configuration of the gate electrode GE is the same as the configuration of the SiC power MOSFET according to the above-described first embodiment illustrated in FIG. 1 in a top surface and a rear surface of an n$^+$-type substrate 1S made of the silicon carbide.

The gate electrode GE is formed of the polycrystalline silicon film PF1, the metal silicide layer SL3 and the metal film MF. The polycrystalline silicon film PF1 illustrated in FIG. 22 is a film formed to have the film thickness of equal to or smaller than 200 nm similarly to the polycrystalline silicon film PF1 described in the first embodiment, and an effect of the polycrystalline silicon film PF1 according to the fourth embodiment is the same as that in the case of the first embodiment. That is, it is possible to suppress the "extrinsic breakdown density" to the level close to that of the Si power MOSFET as illustrated in FIG. 2 by forming the polycrystalline silicon film PF1 having the film thickness of equal to or smaller than 200 nm in contact with the gate insulating film GOX. However, when the gate electrode GE is formed using only the polycrystalline silicon film PF1, there are some cases where it is difficult to reduce the gate electrode resistance to the level required from the viewpoint of the device operation because there is an upper limit in the film thickness as 200 nm, that is, there is a lower limit in the sheet resistance of the gate electrode GE. Thus, the polycrystalline silicon film PF2 is additionally formed on the polycrystalline silicon film PF1 so as to reduce the gate electrode resistance in the first embodiment. With respect to this, in the fourth embodiment, the desired gate electrode resistance is achieved by forming the metal silicide layer SL3 and the metal film MF, instead of the polycrystalline silicon film PF2, on the polycrystalline silicon film PF1.

<Method of Manufacturing SiC Power MOSFET>

The SiC power MOSFET according to the fourth embodiment is configured as described above, and a method of manufacturing the same will be described hereinafter with reference to the drawings.

Figure 23:
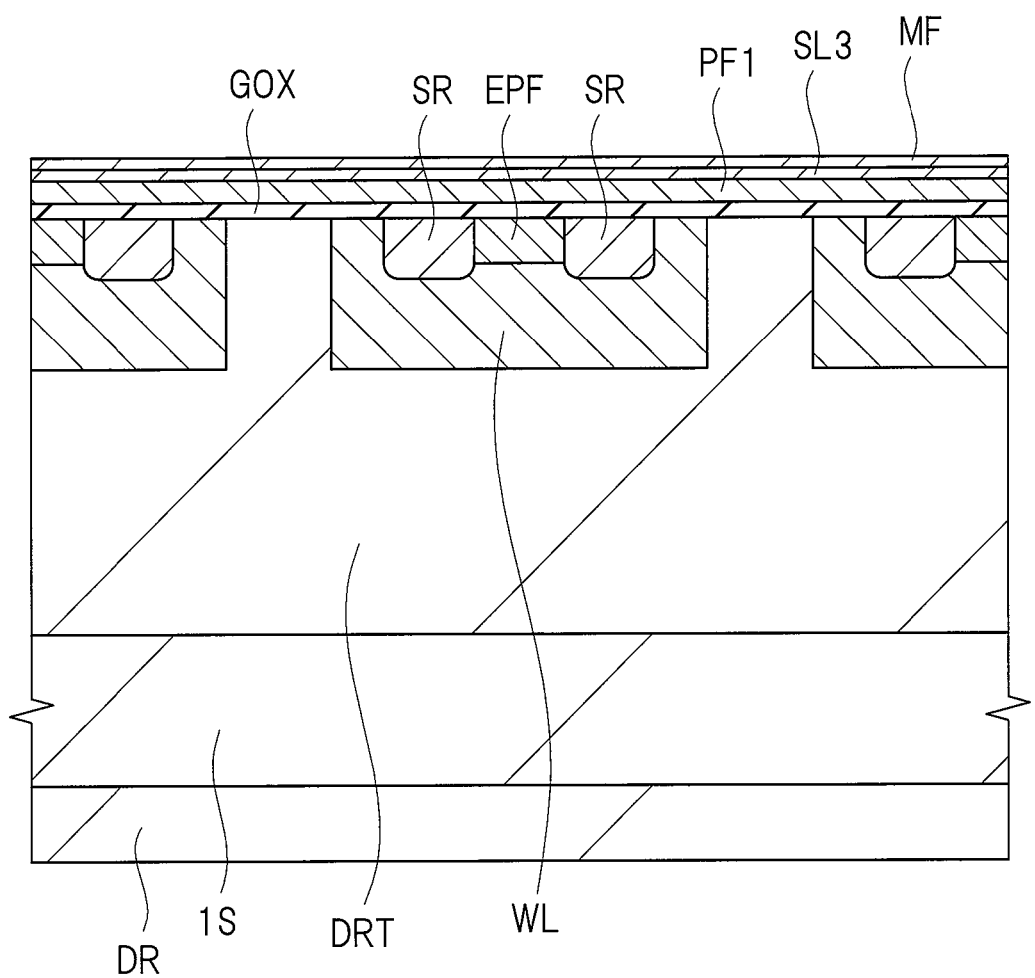
FIG. 23 is a cross-sectional view illustrating a manufacturing process of the SiC power MOSFET according to the fourth embodiment.

First, steps until FIG. 23 are the same as the content described with reference to FIGS. 5 to 9 in the first embodiment. That is, in the steps until FIG. 23, the polycrystalline silicon film PF1 having the film thickness of equal to or smaller than 200 nm is deposited across the entire top surface of the substrate (wafer) 1S as illustrated in FIG. 9.

Next, a sixth metal film made of, for example, the nickel film is deposited on the top surface of the polycrystalline silicon film PF1 using, for example, the sputtering method as illustrated in FIG. 23. A thickness of the sixth metal film is about, for example, 0.05 μm. Subsequently, the sixth metal film and the polycrystalline silicon film PF1 are caused to react with each other across the entire surface on the polycrystalline silicon film PF1 by performing the heat treatment at 500 to 900° C., thereby forming the metal silicide layer SL3. Further, the metal film MF is formed by depositing a seventh metal film made of, for example, the aluminum film, using the sputtering method, for example. A thickness of the metal film MF is about, for example, 0.05 μm to 0.2 μm.

Figure 24:
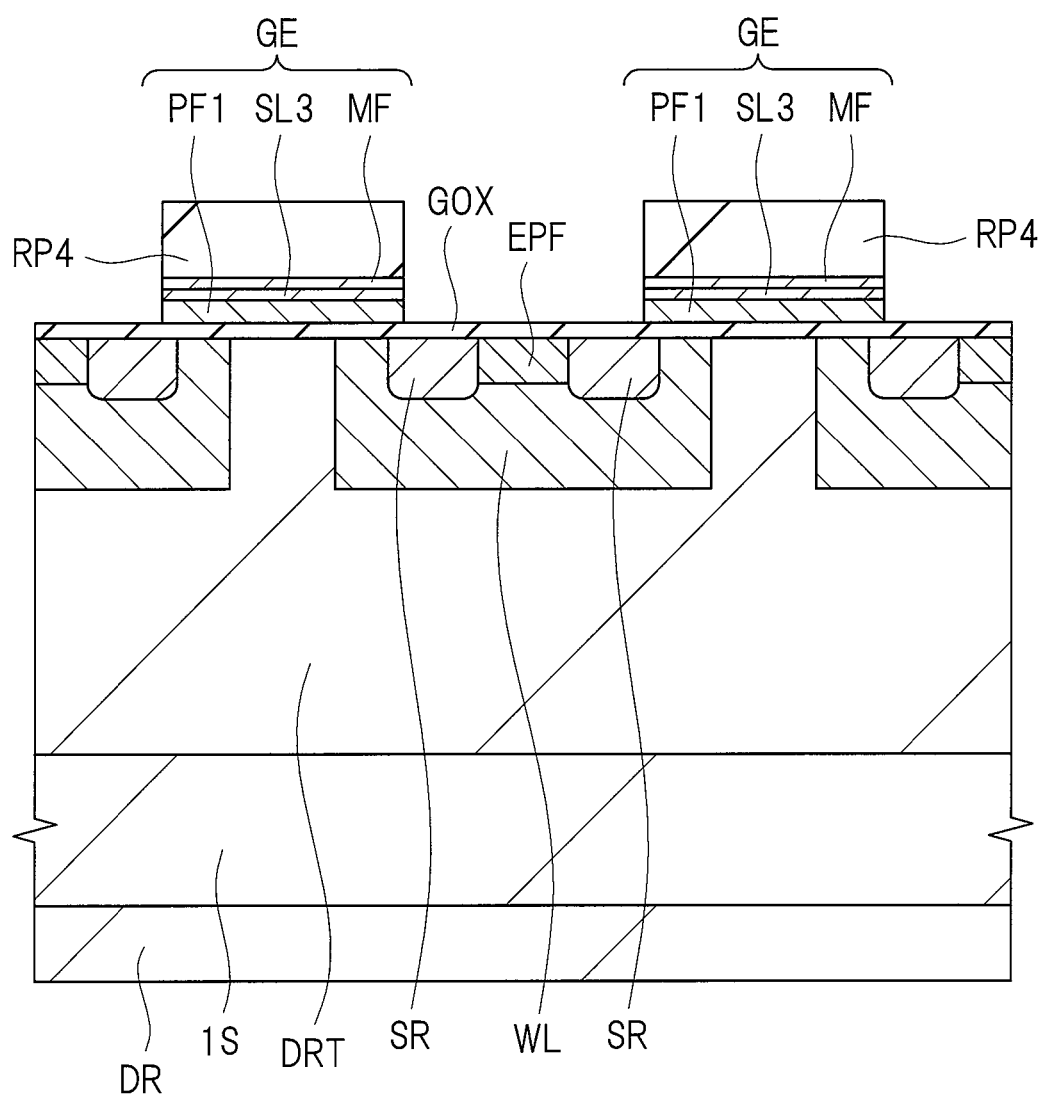
FIG. 24 is a cross-sectional view illustrating a manufacturing process of the SiC power MOSFET after FIG. 23.

Further, the resist pattern RP4 is formed on the metal film MF as illustrated in FIG. 24. Thereafter, the gate electrode GE formed of the laminated film of the polycrystalline silicon film PF1, the metal silicide layer SL3 and the metal film MF is formed by processing the polycrystalline silicon film PF1, the metal silicide layer SL3 and the metal film ME by the dry etching method using the resist pattern PR4 as the mask.

The subsequent steps are the same steps of forming the interlayer insulating film IL, the opening portion OP, the metal silicide layer SL1, the source electrode SE, the metal silicide layer SL2, and the drain electrode DE according to the above-described first embodiment, and these components are formed also in the fourth embodiment. Thereafter, the external wiring is electrically connected to each of the gate electrode GE, the source electrode SE, and the drain electrode DE.

In this manner, according to the fourth embodiment, the gate electrode GE is formed with the two layers, that is, the polycrystalline silicon film PF1 having the film thickness of equal to or smaller than 200 nm is formed as the damage suppressing layer, and the metal silicide layer SL3 and the metal film MF are formed by the silicide reaction on the upper surface of the polycrystalline silicon film PF1 as the resistance reducing layer in the SiC power MOSFET using the silicon carbide. Accordingly, it is possible to achieve the gate electrode resistance required from the viewpoint of the device operation while suppressing the "extrinsic breakdown density", as much as in the Si power MOSFET, also in the SiC power MOSFET according to the fourth embodiment.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the embodiments described above, the description has been made regarding the example in which the polycrystalline silicon film is used as the damage suppressing layer, but technical idea according to the embodiments described above is not limited thereto. That is, the technical idea according to the embodiments described above can be widely applied to cases in which the damage suppressing layer, which is in direct contact with the top surface of the gate insulating film PDX, and the substrate material which is in direct contact with the rear surface of the gate insulating film GOX, are formed using materials having different thermal expansion rates. In other words, the essence of the technical idea according to the embodiments described above is the point of mitigating the stress to be applied to the gate insulating film GOX interposed between the substrate material and the damage suppressing layer in a case in which the damage suppressing layer and the substrate material described above have different thermal expansion rates, and there is no reason for limiting the technical idea according to the embodiments described above to the case of forming the damage suppressing layer with the polycrystalline silicon film when considering the essence.

Incidentally, it is obvious that materials, conductivity types, manufacturing conditions and the like, for example, of the respective components of the SiC power MOSFET are not limited by the description of the above embodiments, and various modifications thereof are possible. For convenience of description, the description has been made with the fixed conductivity types of the semiconductor substrate and the semiconductor film in the present specification, but the present invention is not limited to the conductivity types described in the above embodiments.

In addition, for example, the above-described MOSFET is the field effect transistor having the structure in which the gate insulating film is made of the silicon oxide film, but the MOSFET intended in the present specification is not limited thereto, and does not exclude a field effect transistor (MOSFET (Metal Insulator Semiconductor Field Effect Transistor)) having a structure in which a gate insulating film is made of an insulating film other than a silicon oxide film.

REFERENCE SIGNS LIST 1S substrate
DE drain electrode
DR drain region
DRT drift layer
EPF potential fixing layer
GE gate electrode
GOX gate insulating film
IL interlayer insulating film
MF metal film
OP opening portion
PF1 polycrystalline silicon film
PF2 polycrystalline silicon film
RP1 resist pattern
RP2 resist pattern
RP3 resist pattern
RP4 resist pattern
RP5 resist pattern
SE source electrode
SL1 metal silicide layer
SL2 metal silicide layer
SL3 metal silicide layer
SR source region
WL well region

The invention claimed is:
1. A semiconductor device comprising:
  (a) a substrate of a first conductivity type which has a first main surface and a second main surface opposite to the first main surface, and is made of a semiconductor material having a larger band gap than silicon;
  (b) a drift layer of the first conductivity type formed on the first main surface of the substrate;
  (c) a well region of a second conductivity type which has a first depth from a top surface of the drift layer, and is obtained by introducing a first impurity of the second conductivity type different from the first conductivity type into the drift layer;
  (d) a source region of the first conductivity type which has a second depth from the top surface of the drift layer, and is disposed in the well region being separated from an end portion of the well region, and into which a second impurity of the first conductivity type is introduced;
  (e) a gate insulating film which is in contact with, at least, the well region between the drift layer and the source region;
  (f) a gate electrode which is in contact with the gate insulating film; and
  (g) a drain region of the first conductivity type formed on the second main surface side of the substrate, wherein the gate electrode includes:
    (f1) a damage suppressing layer which is in contact with the gate insulating film and suppresses damage on the gate insulating film; and
    (f2) a resistance reducing layer which is formed on the damage suppressing layer and reduces a gate electrode resistance more than a case without providing the resistance reducing layer, and the damage suppressing layer is formed using a second material different from a first material for forming the drift layer and the well region,
  wherein the first material and the second material have different thermal expansion rates, and
  wherein a thickness of the damage suppressing layer is equal to or smaller than 200 nm.
2. The semiconductor device according to claim 1, wherein the first material for forming the substrate, the drift layer and the well region is silicon carbide.
3. The semiconductor device according to claim 2, wherein the second material for forming the damage suppressing layer is polycrystalline silicon.
4. The semiconductor device according to claim 3, wherein the resistance reducing layer is formed using a polycrystalline silicon film.
5. The semiconductor device according to claim 3, wherein the resistance reducing layer is formed using a metal silicide film or a metal film.
6. The semiconductor device according to claim 3, wherein the resistance reducing layer is formed using a laminated film of a metal silicide film and a metal film formed on the metal silicide film.
7. The semiconductor device according to claim 1, wherein the first conductivity type is an n-type, and the second conductivity type is a p-type.
8. A method of manufacturing a semiconductor device, comprising the steps of:
  (a) preparing a substrate of a first conductivity type made of a semiconductor material having a larger band gap than silicon;
  (b) forming a drift layer of the first conductivity on a first main surface of the substrate;
  (c) forming a drain region of the first conductivity type on a second main surface, which is opposite to the first main surface, of the substrate;
  (d) forming a well region of a second conductivity type which has a first depth from a top surface of the drift layer by introducing a first impurity of the second conductivity type different from the first conductivity type into the drift layer;
  (e) forming a source region of the first conductivity type which has a second depth from the top surface of the drift layer and is separated from an end portion of the well region by introducing a second impurity of the first conductivity type into the well region after the step (d);
  (f) forming a gate insulating film including a part which is in contact with, at least, the well region between the drift layer and the source region after the step (e); and
  (g) forming a gate electrode which is in contact with the gate insulating film after the step (f), wherein, the step (g) includes the steps of:
    (g1) forming a damage suppressing layer which is in contact with the gate insulating film and suppresses damage on the gate insulating film; and
    (g2) forming a resistance reducing layer which is formed on the damage suppressing layer and reduces a gate electrode resistance more than a case without providing the resistance reducing layer, and
  wherein the damage suppressing layer is formed using a second material different from a first material for forming the drift layer and the well region,
  wherein the first material and the second material have different thermal expansion rates, and
  wherein a thickness of the damage suppressing layer to be formed in the step (g1) is equal to or smaller than 200 nm.
9. The method of manufacturing the semiconductor device according to claim 8,
  wherein the first material for forming the substrate, the drift layer and the well region is silicon carbide,
  in the step (g1), the damage suppressing layer is formed using a polycrystalline silicon film, and
  in the step (g2), the resistance reducing layer is formed using the polycrystalline silicon film.
10. The method of manufacturing the semiconductor device according to claim 8,
  wherein the first material for forming the substrate, the drift layer and the well region is silicon carbide,
  in the step (g1), the damage suppressing layer is formed using a polycrystalline silicon film, and
  in the step (g2), the resistance reducing layer is formed using a metal silicide film or a metal film.
11. The method of manufacturing the semiconductor device according to claim 8,
  wherein the first material for forming the substrate, the drift layer and the well region is silicon carbide,
  in the step (g1), the damage suppressing layer is formed using a polycrystalline silicon film, and
  in the step (g2), the resistance reducing layer is formed using a metal silicide film and a metal film on the metal silicide film.

* * * * *